United States Patent
Tardif et al.

(10) Patent No.: US 9,646,623 B2
(45) Date of Patent: May 9, 2017

(54) MIX BUFFERS AND COMMAND QUEUES FOR AUDIO BLOCKS

(71) Applicant: Microsoft Corporation, Redmond, WA (US)

(72) Inventors: John A. Tardif, Sammamish, WA (US); Brian Lloyd Schmidt, Bellevue, WA (US); Sunil Kumar Vemula, Sunnyvale, CA (US); Robert N. Heitkamp, Sammamish, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 666 days.

(21) Appl. No.: 13/766,128

(22) Filed: Feb. 13, 2013

(65) Prior Publication Data

US 2013/0212341 A1 Aug. 15, 2013

Related U.S. Application Data

(60) Provisional application No. 61/599,058, filed on Feb. 15, 2012.

(51) Int. Cl.
| | |
|---|---|
| *G10L 19/24* | (2013.01) |
| *G10L 19/125* | (2013.01) |
| *G10L 99/00* | (2013.01) |
| *G06F 12/02* | (2006.01) |
| *G06F 12/00* | (2006.01) |
| *H03H 17/06* | (2006.01) |
| *G11B 20/10* | (2006.01) |

(52) U.S. Cl.
CPC ............ *G10L 19/125* (2013.01); *G06F 12/00* (2013.01); *G06F 12/02* (2013.01); *G10L 19/24* (2013.01); *G10L 99/00* (2013.01); *H03H 17/0685* (2013.01); *G06F 2213/28* (2013.01); *G11B 20/10037* (2013.01); *G11B 20/10046* (2013.01); *G11B 2220/2516* (2013.01)

(58) Field of Classification Search
CPC ..... G10L 99/00; G06F 12/00; G06F 2213/28; G11B 20/10037
See application file for complete search history.

(56) References Cited

U.S. PATENT DOCUMENTS

| | | | | |
|---|---|---|---|---|
| 4,914,653 | A | * | 4/1990 | Bishop et al. ............... 370/462 |
| 5,054,085 | A | | 10/1991 | Meisel et al. |
| 5,613,136 | A | * | 3/1997 | Casavant et al. ............ 712/28 |

(Continued)

OTHER PUBLICATIONS

IP.com concept search. Mar. 13, 2015.*

(Continued)

*Primary Examiner* — Midys Rojas
*Assistant Examiner* — Khoa D Doan

(57) ABSTRACT

The subject disclosure is directed towards a technology that may be used in an audio processing environment. Nodes of an audio flow graph are associated with virtual mix buffers. As the flow graph is processed, commands and virtual mix buffer data are provided to audio fixed-function processing blocks. Each virtual mix buffer is mapped to a physical mix buffer, and the associated command is executed with respect to the physical mix buffer. One physical mix buffer mix buffer may be used as an input data buffer for the audio fixed-function processing block, and another physical mix buffer as an output data buffer, for example.

20 Claims, 13 Drawing Sheets

(56) References Cited

U.S. PATENT DOCUMENTS

| | | | |
|---|---|---|---|
| 5,870,599 A * | 2/1999 | Hinton | G06F 9/3802 711/207 |
| 5,956,680 A * | 9/1999 | Behnke | G10H 7/002 704/201 |
| 6,055,619 A | 4/2000 | North et al. | |
| 6,105,119 A * | 8/2000 | Kerr et al. | 711/219 |
| 6,112,265 A | 8/2000 | Harriman et al. | |
| 6,161,153 A * | 12/2000 | Porterfield | G06F 13/4059 710/310 |
| 6,266,753 B1 * | 7/2001 | Hicok et al. | 711/202 |
| 6,463,406 B1 | 10/2002 | McCree | |
| 6,807,615 B1 * | 10/2004 | Wong | G06F 5/10 710/52 |
| 7,376,475 B2 * | 5/2008 | Fay | G10H 1/0041 700/94 |
| 8,098,255 B2 | 1/2012 | Fouladi et al. | |
| 8,286,188 B1 * | 10/2012 | Brief | G06F 9/544 719/312 |
| 8,924,684 B1 * | 12/2014 | Vincent | G06F 12/1027 711/203 |
| 2002/0107594 A1 * | 8/2002 | Taylor | G06F 9/544 700/94 |
| 2003/0046054 A1 * | 3/2003 | Wheeler | G06F 17/5022 703/15 |
| 2003/0098805 A1 * | 5/2003 | Bizjak | 341/139 |
| 2004/0015653 A1 | 1/2004 | Trantham | |
| 2004/0024590 A1 | 2/2004 | Lee | |
| 2004/0220801 A1 | 11/2004 | Sato | |
| 2005/0228971 A1 * | 10/2005 | Samra et al. | 712/217 |
| 2005/0246504 A1 * | 11/2005 | Frey | G06F 3/0607 711/150 |
| 2006/0041735 A1 * | 2/2006 | Hepkin | G06F 12/1081 711/206 |
| 2007/0253561 A1 * | 11/2007 | Williams | H04S 7/301 381/58 |
| 2008/0034161 A1 | 2/2008 | Savell | |
| 2008/0127182 A1 | 5/2008 | Newport et al. | |
| 2008/0282055 A1 * | 11/2008 | Yang | G06F 12/1027 711/207 |
| 2009/0031037 A1 | 1/2009 | Mendell et al. | |
| 2009/0089532 A1 * | 4/2009 | Wang | G06F 5/065 711/170 |
| 2009/0171677 A1 | 7/2009 | Singhal et al. | |
| 2009/0228125 A1 * | 9/2009 | Stewart | G06F 17/30017 700/94 |
| 2009/0228882 A1 * | 9/2009 | Wang | G06F 9/5077 718/1 |
| 2012/0216226 A1 | 8/2012 | Humphrey et al. | |
| 2012/0311208 A1 * | 12/2012 | Manula | G06F 13/124 710/108 |
| 2014/0056309 A1 * | 2/2014 | Singh | H04L 49/70 370/401 |
| 2015/0046661 A1 * | 2/2015 | Gathala | G06F 3/0613 711/147 |

OTHER PUBLICATIONS

"API Migration Guide: Managed DirectX 1.1 to XNA Framework", available at: http://msdn.microsoft.com/en-us/library/bb197956(v=xnagamestudio.30)aspx, retrieved on: Oct. 12, 2012, 15 pages.

"Power Efficient Multimedia Playback on Mobile Platforms", available at: http://multicoreinfo.com/research/intel/Power.pdf, retrieved on: Oct. 12, 2012, 20 pages.

"International Search Report", mailed Jun. 2, 2013, Application No. PCT/US2013/026211, filed date Feb. 14, 2013, pp. 1-12.

Savell, Thomas Craig, "Sample Rate Converter with Automatic Anti-aliasing Filter," U.S. Appl. No. 13/765,686, filed Feb. 12, 2013, 43 pages.

"Non-Final Office Action", received for U.S. Appl. No. 13/765,686, Mailed Date: Jan. 5, 2015, 10 Pages.

* cited by examiner

MIX BUFFERS AND COMMAND QUEUES FOR AUDIO BLOCKS

CROSS-REFERENCE TO RELATED APPLICATION

The present application claims priority to U.S. provisional patent application Ser. No. 61/599,058, filed Feb. 15, 2012.

BACKGROUND

An audio fixed function processor has hardware blocks that perform specific functions on audio data such as sample rate conversion, filtering, equalization, occlusion, pan, compression (dynamic range) and so on. A (typically) large audio flow graph describes how audio data from sound sources (which may be on the order of thousands in a video game application) are to be processed by the blocks and sub-mixed with other processed data, before going to the next block, and so forth. This audio flow graph is walked to perform the processing and mixing into the final output.

Heretofore providing the audio data to the fixed function blocks needed complex processing and a large amount of local memory for input and output samples, and/or a large amount of main memory bandwidth to import/export the audio samples. For example, when the software reaches a node in the graph, the software needs to fetch the audio data from the source specified in the node, provide it to the specified function block, track when the function block is done with processing, manage the mixing the output of the block, move to the next node and so forth.

SUMMARY

This Summary is provided to introduce a selection of representative concepts in a simplified form that are further described below in the Detailed Description. This Summary is not intended to identify key features or essential features of the claimed subject matter, nor is it intended to be used in any way that would limit the scope of the claimed subject matter.

Briefly, various aspects of the subject matter described herein are directed towards a technology that may be used in an audio processing environment, in which virtual mix buffers have physical mix buffers allocated thereto. This may include processing an allocation command corresponding to a virtual mix buffer associated with audio data to be processed, including allocating a physical mix buffer for the virtual mix buffer, and providing an identifier of the physical mix buffer to an audio subsystem block. An audio processing-related command is provided to the audio subsystem block, and the physical mix buffer is used at the audio subsystem block for processing audio data based upon the audio processing-related command.

In one aspect, a mix buffer component is configured to receive an allocation command that corresponds to a node in an audio flow graph and a virtual mix buffer associated with that node. The mix buffer component allocates a physical buffer for the virtual mix buffer, and provides access to the physical buffer to a fixed-function audio processing component of a set of one or more fixed-function audio processing components.

In one aspect, there is described receiving at an audio fixed-function processing block a command queue comprising a plurality of commands. A selected command is prepared to be executed, including determining whether input audio data associated with the selected command is ready for processing by the audio fixed-function processing block, and determining whether an output buffer associated with the selected command is ready to receive processed data. If the input data is not ready or the output buffer is not ready, another command from the queue is selected for attempted execution. When the input data and output buffer for a command are ready, the command is executed, including processing the input data at the audio fixed-function processing block into output data for the output buffer.

Other advantages may become apparent from the following detailed description when taken in conjunction with the drawings.

BRIEF DESCRIPTION OF THE DRAWINGS

The present invention is illustrated by way of example and not limited in the accompanying figures in which like reference numerals indicate similar elements and in which.

DETAILED DESCRIPTION

Various aspects of the technology described herein are generally directed towards mix buffers, including virtual mix buffers and processing queues for each of the fixed function audio processing blocks. The mix buffers and processing queues provide for efficiently scheduling audio processing tasks while simplifying much of the audio mix buffer management. As will be further understood, the use of processing queues for fixed function audio blocks, along with the use of mix buffers in hardware, significantly reduce main memory bandwidth and local memory size requirements. Further, mix buffer state tracking simplifies the scheduling and handling of audio processing tasks.

It should be understood that any of the examples herein are non-limiting. For instance, 128 physical buffers are described as present in one implementation, 128 samples per audio frame are described, example components are described and so on, however it is understood that these are only examples, and that any practical numbers may be used for the values and the like, and other components may be used other than those exemplified herein. Further, software may be used instead of hardware as described. Still further, an audio game console is shown as one example computing environment, however any other suitable computer-based device such as a personal computer, tablet device, mobile computer device and the like may implement the technology described herein. As such, the present invention is not limited to any particular embodiments, aspects, concepts, structures, functionalities or examples described herein. Rather, any of the embodiments, aspects, concepts, structures, functionalities or examples described herein are non-limiting, and the present invention may be used various ways that provide benefits and advantages in computing and audio technology in general.

Figure 1:
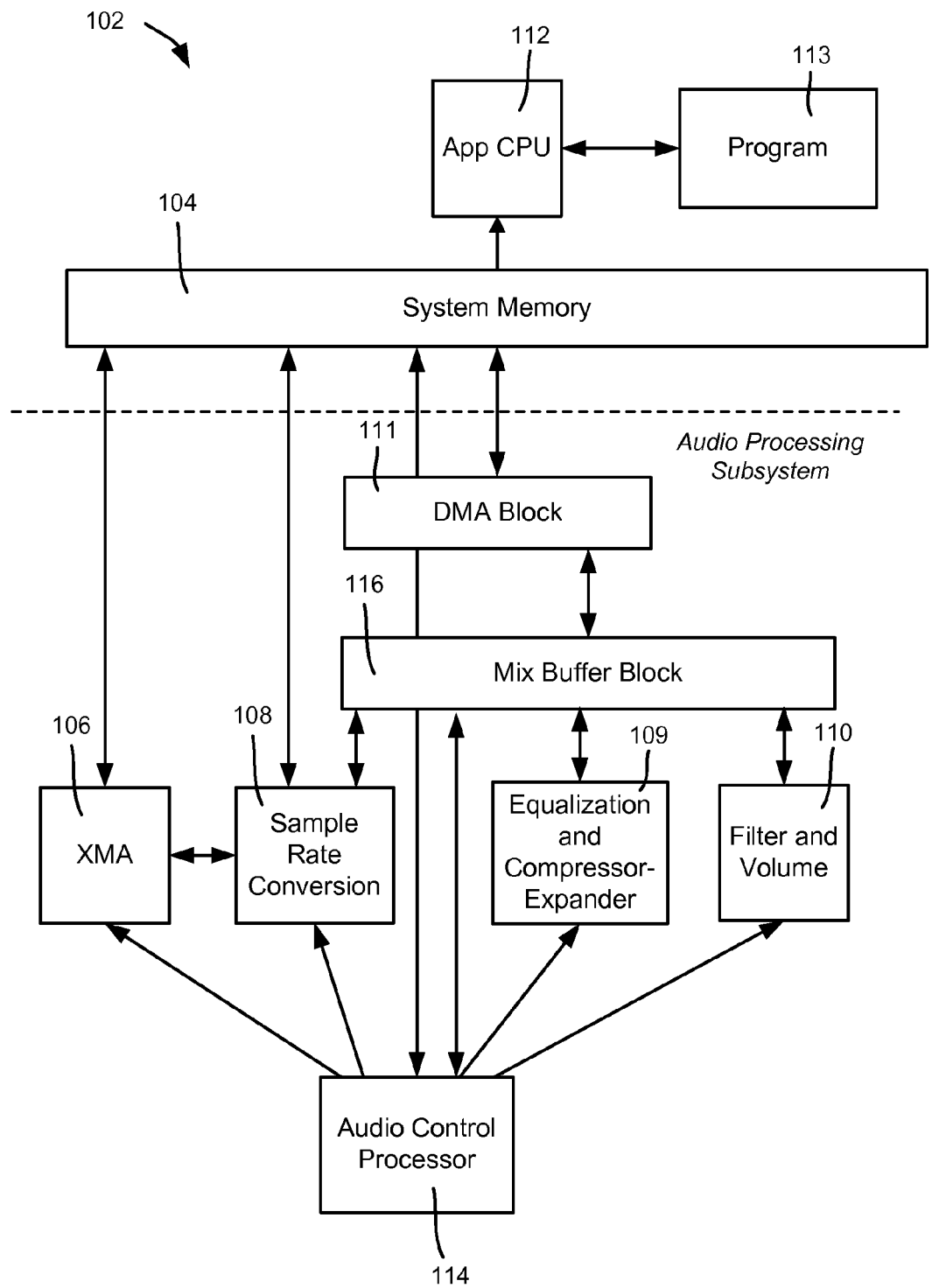
FIG. 1 is a block diagram showing various example components of an audio processing environment, including components that user mix buffers to buffer and transport data, according to one example embodiment.

FIG. 1 shows an example sound processing environment 102 (e.g., implemented in a game console) that uses mix buffers and processing queues as described herein. In general, and as described herein, the environment includes an audio processing subsystem comprises fixed-function hardware blocks (also referred to herein as fixed-function audio components, generally for commonly-used audio processing functions) and a programmable, embedded audio control processor that control those blocks. Also present in the audio processing subsystem is DMA (direct memory access) control plus dedicated fast memory associated with the fixed-function blocks. To facilitate high speed operation and minimize traffic on the main memory bus, the fixed-function blocks operate on internal memory referred to herein as mixing buffers (or alternatively mix buffers). A mixing buffer comprises a block of memory that stores one full audio frame of data. In general and as described below, the fixed-function blocks read data from one or two mixing buffers and block write their output to another mixing buffer; (note that this is only the general scenario, and some exceptions are described below).

Figure 2:
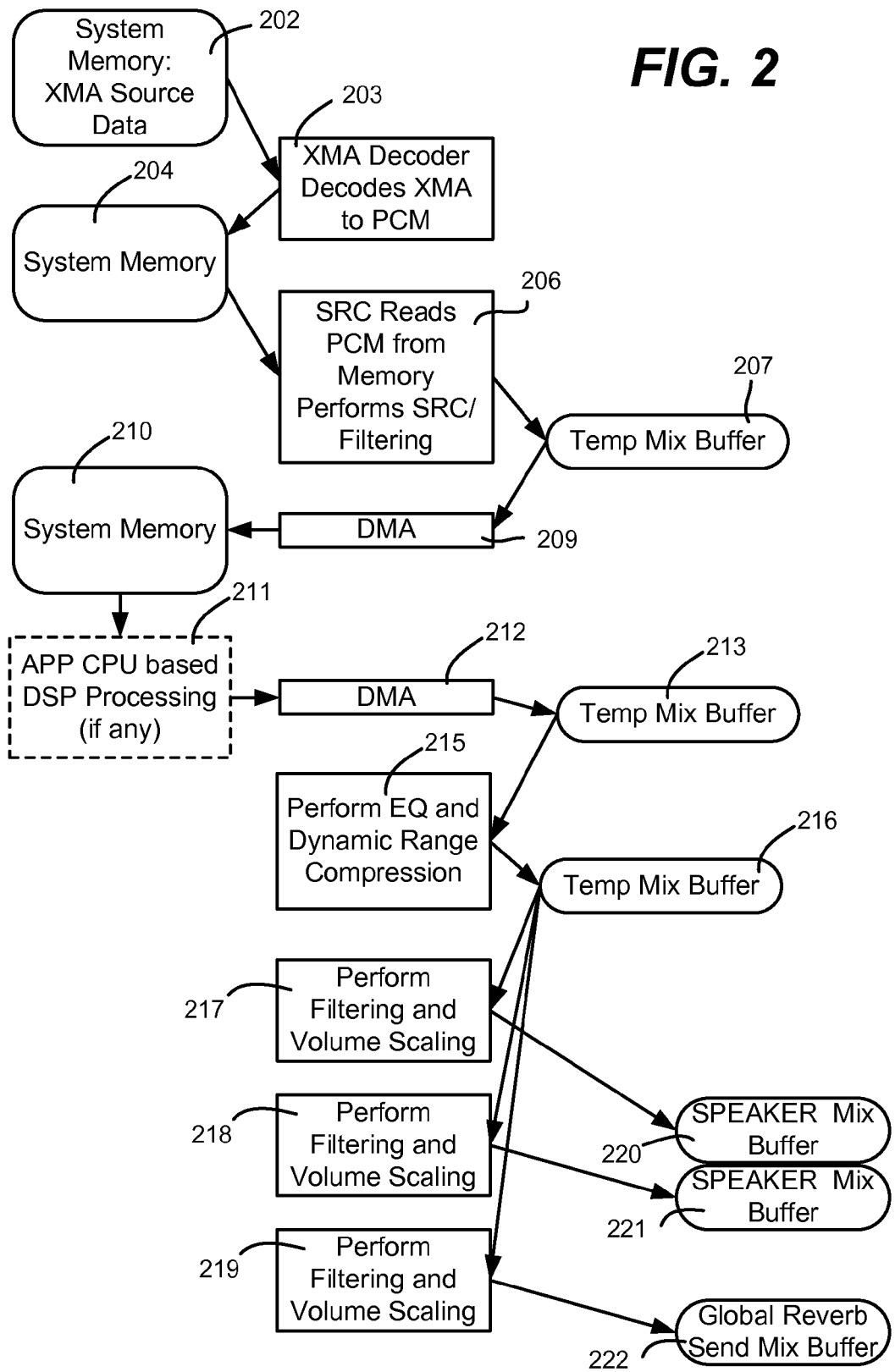
FIG. 2 is a block/dataflow diagram representing the use of mix buffers according to one example embodiment.

Compressed audio data (e.g., referred to as XMA data in one compressed format) is stored in main system memory 104 and processed by an XMA decoder block 106. The XMA decoder block 106 decodes a portion of the stored XMA data and returns the decoded data (PCM samples) to the main system memory 104, e.g., into an XMA decode buffer therein. This is also represented in FIG. 2 via steps/blocks 202-204.

As described herein, various fixed function hardware blocks 108-111 receive commands and audio data, including via queued commands and buffered data provided via mix buffers. The exemplified fixed function hardware blocks 108-110 include a sample rate conversion (SRC) block 108, equalization and compressor-expander (EQ/CMP) block 109, filter/volume block (FLT/VOL) 110 and a DMA block 111; other blocks including ones not yet in use are feasible for inclusion in the audio processing environment 102.

In general, the mix buffers act as data buffers and transport mechanisms between the fixed function audio processing subsystem blocks and other audio processing subsystem blocks, as well as between audio processing subsystem blocks and main system memory. Thus, for example, one or more mix buffers may be used to provide input data to a given fixed function audio processing subsystem block, which then writes output data to one or more other mix buffers for further processing, and so on.

As will be understood, mix buffers act as a final mixing destination for audio, e.g., each speaker output for the system (or an individual player). As each sound is processed, its subsequent output is mixed into these buffers. Mix buffers thus act as temporary storage locations as buffers of audio data are passed between hardware blocks. In conjunction with the DMA block 111, mix buffers also serve as a mechanism to pass data from the audio processing subsystem hardware and audio sub-system up to main system memory 104 for application CPU 112 processing, as well as transfer from main system memory 104 back to the audio processing subsystem. Mix buffers are allocated by the audio control processor 114, e.g., based upon an ALLOC command, described below.

In one implementation, mix buffers have identifiers that are virtual, providing for any number of virtual mix buffers that are each mapped (when needed) to audio subsystem memory comprising a physical buffer; in one implementation, there is an identifier for each node in the audio flow graph, and that identifier corresponds to a virtual mix buffer identifier. Thus, only when the audio control processor allocates a mix buffer is a physical mix buffer assigned to the virtual buffer/identifier. In one implementation, there are 128 physical mix buffers. In one implementation, mix buffers contain a full audio frame's worth of data (128 samples), at a resolution of 24 bits (signed integer, s0.23 format) stored in 28-bit containers providing footroom bits to reduce quantization when the attenuation shift factor is non-zero.

More particularly, because there are only 128 physical mix buffers and typical applications (e.g., game titles) need many more than that, the mix buffers use a virtual ID (VID) system to simplify management of buffers. As described herein, the audio control processor 114 requests the mix buffer block 116 to allocate a physical buffer ID to a virtual ID. After a successful allocation, the audio control processor 114 may send commands to the hardware blocks with the virtual IDs to be used for the commands; (if there are no buffers to be allocated, the request will fail). Prior to insertion in each block's command queue, the hardware requests the mix buffer block 116 to perform virtual to physical ID lookups for each buffer. This way, the physical IDs (which can be mapped/pointers to memory addresses or the memory addresses themselves) can be directly used by the blocks for the commands in their queue without performing another lookup operation. The blocks will, however, request a lock for each physical buffer prior to using the buffers for processing a command The state of each mix buffer in use is tracked, so that the memory used thereby may be reclaimed when no longer needed. More particularly, each physical mix buffer has state associated therewith. The mix buffer state is managed by the mix buffer block 116. The state for each buffer includes the following:

| Data | Size (bits) | Description |
|---|---|---|
| Valid | 1 | Status of physical buffer. 1'b0 - invalid or free 1'b1 - valid or in use |

-continued

| Data | Size (bits) | Description |
| --- | --- | --- |
| NumIn | 10 | Number of inputs that are expected to be blended together before this buffer is ready. 0 means done with inputs, 0x3FF means there is an indeterminate number of inputs (and the state can only proceed once updated via control register write). This is decremented by the MB hardware after each input device completes writing a frame of samples. |
| NumOut | 10 | Number of times that the mix buffer contents are expected to be used. 0 means done with outputs, 0x3FF means there is an indeterminate number of inputs (and the state can only be updated to free via control register write). This is decremented by the MB hardware after each output device completes reading a frame of samples. |
| Empty | 1 | Used on input to determine whether to write directly to or sum with previous value. Note, it is illegal to program this to zero for allocation step. This is included for debug purpose and sample behavior is unknown. Cleared by MB after initial write. |
| Lock | 3 | Indicates device currently locking the buffer:<br>3'b000 - None<br>3'b001 - SRC<br>3'b010 - EQ/CMP<br>3'b011 - DMA<br>3'b100 - FLT<br>3'b101 to 3'b111 - Reserved<br>Cleared by MB after 128 samples are read or written unless subsequent lock request is from the same SHAPE unit as indicated by "Next Lock" field. In this case lock is held until next 128 samples are read or written. |
| NextLock | 1 | Indicates current lock device requested additional lock. |
| Gain | 3 | Amount to right shift any inputs prior to summation into the buffer. Coarse gain adjust to avoid overflow when summing many sources. |

The following describes an example management sequence used by the mix buffer block 116. Note the description is presented as though single threaded, in a typical implementation, the mix buffer management occurs in parallel with the sample I/O for audio frames.

After reset, all mix buffers are allocated equal to zero. The mix buffer state may be maintained in a combination of registers and RAM based on the retrieval bandwidth and access patterns supported. There is a separate copy of state for each physical mix buffer. A state maintenance controller reads and updates state as needed. When an allocate command is received by the fixed function audio control processor 114, the controller looks for an unallocated buffer; (note that in debug mode, for example, the host CPU also may allocate a mix buffer). Once the controller finds an unallocated, the allocated state bit is set to one, empty is set, and numIn, numOut, and gain are set based upon values supplied with the allocate command. A positive acknowledgement of the allocate command includes the physical mix buffer allocated to the requested virtualID.

The fixed function hardware blocks then make requests to lookup physical buffer IDs corresponding to the virtual IDs. The blocks can then proceed to request a lock for each given physical buffer ID in preparation for reading/writing the buffer. If the Lock state is none, the mix buffer controller assigns the Lock to that hardware block and returns an acknowledgement. The hardware block then processes the 128 samples in an audio frame. Once the samples have been processed, the NumIn, NumOut, and Lock values are updated. Once all expected outputs have been performed (i.e. NumOut==0), then the allocate bit is reset to zero (cleared) to return that physical mix buffer back to the free pool.

A positive acknowledgement of the allocate command includes the physical mix buffer allocated to the requested virtualID. Hardware blocks make requests to read/write to given virtual buffer IDs. If the deviceID is none, the mix buffer controller locks down that physical buffer for that block's interface, assigns the deviceID to that hardware block, and returns an acknowledgement with the physical mix buffer that will be used when reading/writing samples for that audio frame. The hardware block processes all (e.g., 128) samples in an audio frame in one implementation. Once the samples have been completely processed, the expectedinputs, expectedoutputs, and deviceID values are updated. Once the expected outputs have been performed (i.e., ==0), the allocate bit is set to zero to return that physical mix buffer back to the free pool.

As can be seen from the above state data description, each input sample to a mix buffer can be added to the current value for that mix buffer entry. Further, each input sample can be coarsely adjusted in gain prior to being added to the current value. As each coarse gain adjusted input sample is (optionally) added to the previous value, the result is clamped (saturated) to 28 bits—the position of the binary point depends on the attenuation shift factor, varying the bit-format from s0.27 to s7.20 as the shift factor varies from 0 to 7 bits. The maximum magnitude for a signal is maintained as part of the buffer state. If overflows occur, that state is maintained as well. The maximum magnitude is updated after each write to the buffer, although the source block will likely only use the data at the end of an input audio frame of samples. The input device may then use the data for potential subsequent write back to its context, (where contexts are used maintain state information and provide control for the fixed function hardware blocks 108-111); context is further described below.

Note that in a game audio engine, managing headroom can be complex, and thus in one implementation, each audio processing subsystem block 108-111 maintains state associated with signal overhead and gain. Each block (except SRC 108) maintains two bits which track whether internal saturation has occurred during processing; one bit is persistent in that it remains set until software clears it, while the other bit is updated by the hardware every audio frame. In addition to the internal saturation bits, each hardware block also maintains two four-bit numbers representing the magnitude of the output of the hardware block. The magnitude is calculated by determining the peak output during the audio frame, and counting the leading zeros of the absolute value of the peak. One four-bit number is maintained with the persistent peak magnitude, the other is reset by the hardware each audio frame.

In addition to monitoring the peak magnitude of each individual hardware block, the peak magnitude of the mix buffers is also maintained. As the output of a hardware block is added to a mix buffer, the peak magnitude is calculated in the same manner (counting leading zeros). Each hardware block state maintains an additional pair of four-bit peak magnitude values. These values represent the peak magnitude of the mix buffer after the hardware block's output has been accumulated into the mix buffer. One four-bit number represents the ongoing, persistent peak magnitude; the other is updated every audio frame. The peak magnitude values are saved in the context of the audio processing subsystem blocks.

To help manage overhead and avoid overflow and saturation, in addition to fine grain gain settings, a 0 to 7 bit right shift may be performed on a hardware block's output prior to accumulation into the output mix buffer. This is designated in the context of each hardware block.

Peak Magnitude Encoding

| Value | Meaning |
| --- | --- |
| B'0000 | Saturation: A value from a calculation to produce an output has overflowed the signed 24-bit range and was replaced with the nearest extreme. Specifically, a value greater than 8,388,607 (0x7F_FFFF) was replaced with 8,388,607 or a value less than −8,388,608 (0x80_0000) was replaced with −8,388,608. |
| B'0001 | Absolute value of the peak was greater than MAX >> 1 (0x3F_FFFF) |
| B'0010 | Absolute value of the peak was greater than MAX >> 2 (0x1F_FFFF) |
| B'0011 | Absolute value of the peak was greater than MAX >> 3 |
| B'0100 | Absolute value of the peak was greater than MAX >> 4 |
| B'0101 | Absolute value of the peak was greater than MAX >> 5 |
| ... | ... |
| B'1110 | Absolute value of the peak was greater than MAX >> 14 |
| B'1111 | Absolute value of the peak was less than or equal to MAX >> 14 |

In general, the audio control processor 114 may comprise a basic embedded, programmable processor that functions to schedule and control the fixed function audio hardware blocks. The audio control processor 114 has a number of functions, including that for each audio frame (128 samples), the audio control processor 114 reads an instruction command list from system memory 104 (as prepared by the application CPU 112) that indicates how, how many, and in what order audio data is read and fed through the audio blocks in order to generate output audio. The actual parameters used by the hardware blocks 108-110 to do the processing are stored in system memory 104 as dedicated context data associated with each hardware block.

The audio control processor 114 also indicates during the allocation process how many times a given mix buffer will be used for input and for output as well as the coarse gain to be used for the buffer. When a mix buffer has been successfully allocated, the physical buffer number is returned to the audio control processor 114 as desired; (note that there is no need for the audio control processor to do anything with this data other than for use in possible debug scenarios). Status/control/debug information is directly accessible to the audio control processor 114 (as well as the app/system CPU 112) via a standard bus interface, which allows visibility into the state of the mix buffers, reset of the unit, flushing, and syncing of the mix block to other aspects of the system. Thus, via a bus Interface, the mix buffer block 116 can be controlled from the app/sys CPU 112 for debug purposes. The visibility into the block 112 is the same as what is available to the audio control processor 114; one logical bus may be shared by both.

The DMA block 111 can transfer audio frames between the mix buffers and system memory 104. The DMA block 111 makes a request to the mix buffer block 116 with the physical buffer ID of the current command in its processing queue. If not currently in use by another device, the mix buffer block 116 locks down that buffer for use by the DMA block 111 and acknowledges that the buffer can be used. After positive acknowledgement from the mix buffer block 116, the DMA block 111 checks the available system memory buffer space before proceeding. If the buffer space is insufficient, the DMA block 111 releases the lock on the mix buffer without reading or writing the buffer. For DMA read channels (system memory to mix buffer), if the system memory buffer is not empty, it will fetch 128 samples from system memory 104 and write those samples into the mix buffer, accumulating with any previous results. Once the 128th sample is received by the mix buffer block 116, the state for the output buffer is updated (NumIn--, Lock->none), and a completion status is sent back to the DMA block 111 including the peak magnitude value. For DMA write channels (mix buffer to system memory), if the system memory buffer is not full, the mix buffer block 116 reads 128 samples from the mix buffer and writes those samples into system memory 104. Once the 128th sample is sent by the mix buffer block 116, the state for the input buffer is updated (NumOut--, Lock->none), and a completion status is sent back to the DMA block 111 including the peak magnitude value.

Turning to other blocks shown in FIGS. 1 and 2, the SRC block 108 may fetch input sample data from system memory 104 (blocks 204 and 206, FIG. 2) via its own memory interface. The SRC block 108 makes a request to the mix buffer block 116 with the physical buffer ID(s) of the current command in its processing queue. If not currently in use by another device, the mix buffer block 116 locks down the buffer(s) for use by the SRC 108 and acknowledges that the buffer(s) can be used. After positive acknowledgement from the mix buffer block 116, the SRC block 108 checks the number of samples available in the system memory buffer before proceeding. If the number of samples is insufficient, the SRC block 108 releases the lock on the mix buffer(s) without writing the buffer(s). If there are enough samples in system memory to generate 128 output samples, the SRC block 108 fetches the samples from system memory 104 and writes 128 samples into the mix buffer(s), accumulating with any previous results. Once the 128th sample is received by the mix buffer block 116, the state for the output buffer(s) are updated (NumIn--, Lock->none), and a completion status is sent back to the SRC block 108 including the peak magnitude value.

As shown in FIG. 2 via blocks 209-213, e.g., after any sample rate conversion, arbitrary Digital Signal Processing (DSP) may be performed via the main application CPU 112. This is facilitated with the DMA block 111 that transports data between the mix buffer block 116 and main application memory 104. Note that the application CPU 112 may perform its DSP processing, including writing its output to output buffers within main system memory into a mixing buffer 213, e.g., before additional processing is done on the data.

Note that the above description and FIG. 2 is only one example, and it is not necessary for the output of the SRC to go back through memory as shown; this is only one option. Indeed, at any point in the processing of the audio flow graph, the contents of a given virtual mix buffer may be sent (via DMA) back to the system memory 104 for additional CPU processing, and placed back (via DMA after processing) into another virtual mix buffer for further flow graph processing. Note however that in one implementation the XMA audio decoder does need to go back into system memory 204, generally because the output block size for the decoder is much larger than the designated audio block size (128 samples), and the SRC usually will be generating more or less samples from an equivalent input block size, and therefore uses memory on its input for the buffering needed to ensure aligned 128 samples block into the virtual mix buffers.

As represented in FIG. 1 (and FIG. 2 via blocks 215-219), similar operations occur with the EQ/CMP block 109 and filter and volume block FLT/VOL 110, although note that (unlike the SRC block 108) these blocks 109 and 110 use a mix buffer 215 for their input rather than system memory, and the FLT/VOL block 110 may output to speaker volume blocks, that is, allocated Speaker Mixing Buffers 220 and 221 collect and mix the samples from multiple sounds for (e.g., stereo) speaker playback and (optionally) global audio effects processing buffers 222.

When the EQ/CMP block 109 has a context in its processing queue, the EQ/CMP block 109 makes requests to the mix buffer block 116 with the physical buffer IDs for the input buffer, the control buffer, and the output buffer to be used for that context. If the buffers are currently in use by another device and/or the input or control data buffers are not complete, the mix buffer block 116 acknowledges with failures. If the buffers are currently not in use by other devices and the input/control data is fully available, the mix buffer block 116 locks down the buffers for use by the EQ/CMP block 109 and acknowledges that the buffers can be used. After positive acknowledgement, the EQ/CMP block 109 then generates and sends 128 samples into the output mix buffer (accumulating with any previous results as needed). Once the 128th sample is received, the state for the input and (optional) control buffers is updated (NumOut--, Lock->none), the state for the output buffer is updated (NumIn--, Lock->none), and a completion status is sent back to the EQ/CMP block 109 including the peak magnitude value.

When the FLT/VOL block 110 has a context in its processing queue, the FLT/VOL block 110 makes requests to the mix buffer block 116 with the physical buffer IDs for the input buffer and the output buffer to be used for that context. If the buffers are currently in use by another device and/or the input buffer is not complete, the mix buffer block 116 acknowledges with failures. If the buffers are currently not in use by other devices and the input data is fully available, the mix buffer block 116 locks down the buffer for use by the FLT/VOL block 110 and acknowledges that the buffer can be used. After positive acknowledgement, the FLT/VOL block 110 generates and sends 128 samples into the output mix buffer (accumulating with any previous results as needed). Once the 128th sample is received, the state for the input buffer is updated (NumOut--, Lock->none), the state for the output buffer is updated (NumIn--, Lock->none), and a completion status is sent back to the FLT/VOL block 110 including the peak magnitude value.

Figure 3:
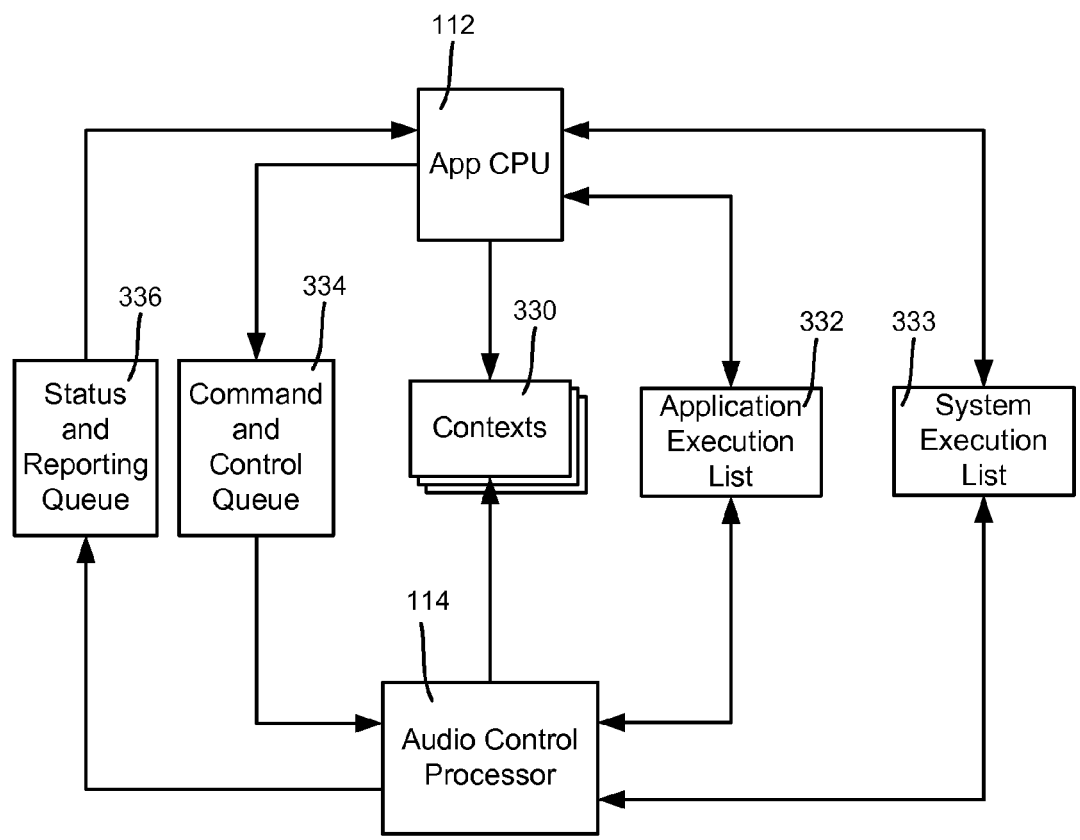
FIG. 3 is a block diagram showing various communication mechanisms used in the audio processing environment, according to one example embodiment.

In one implementation, the individual audio fixed-function hardware blocks are controlled by various mechanisms, including contexts 330 and one or more execution lists 332 and 333, as generally represented in FIG. 3. The contexts 330, which may be stored in main memory 104, maintain state information and provide control for the processing elements within the fixed function hardware blocks 108-111. The contexts 330 are initially generated by the application CPU 112 (e.g., as directed by a program 113) and can be updated by the CPU 112 or the audio control processor 114. The contexts 330 are read into the sound processing subsystem of the audio processing environment 102 with each audio frame, as needed by the individual hardware blocks 108-110. For an example an audio frame size of 128 samples and a sampling rate of 48 kHz, contexts are swapped at a rate of 375 Hz per audio channel.

The audio control processor 114 also updates context data for each of the blocks as requested by the CPU 112. This allows the main CPU 112 to avoid hardware polling and/or spin lock loops as it updates the audio processing subsystem with changes to input data or context data (e.g. more available bitstream data, tweaks to audio parameters, and so forth). The audio control processor 114 feeds audio block processing commands to the fixed function hardware components based on commands in a command queue 334. The audio control processor 114 feeds back status to the CPU 112 via a status/resolution queue 336 in system memory. The processor 114 also may be used in supporting diagnostic, development, and debug processing for the audio processing subsystem as a whole.

The execution lists 332, 333 each comprises a list of meta-commands that are processed by the audio control processor 114. Because the audio control processor 114 is programmable and flexible, the format and function of an execution list is likewise flexible. For example, some of the meta-commands have implicit data, while others have explicit arguments. The meta-commands also specify where the specific hardware blocks 108-111 get their input and write their output through the use of mix buffers, which are allocated by the audio control processor 114 as described herein.

Other queues managed by the audio control processor 114 help reduce system and application CPU/audio processing subsystem hardware interlocks. The command and control queue 334 gives the audio control processor 114 a series of commands to execute whenever the audio control processor 114 has a chance (usually at the end of processing a current audio frame). Note that the command and control queue 334 may be read and executed only once (whereas the execution list is read once for every audio frame output). The command and control queue 334 provides a mechanism for having the CPU 112 update any block context data on an audio frame boundary without needing a hardware interlock with the audio processing subsystem hardware. Examples of such updates include supplying more bitstream data for the XMA block 106, updating context parameters for various blocks, pointing to a new execution list (usually done when changing the audio processing flow graph), and so forth.

Another queue is the status and reporting queue (SRQ) 336. This queue 336 is used by the audio control processor 114 to make the CPU 112 aware of any information that does not need real time response. Examples include updating bitstream buffer consumption, errors/warnings/flags, debug data, performance data, status, and so forth.

Figure 4:
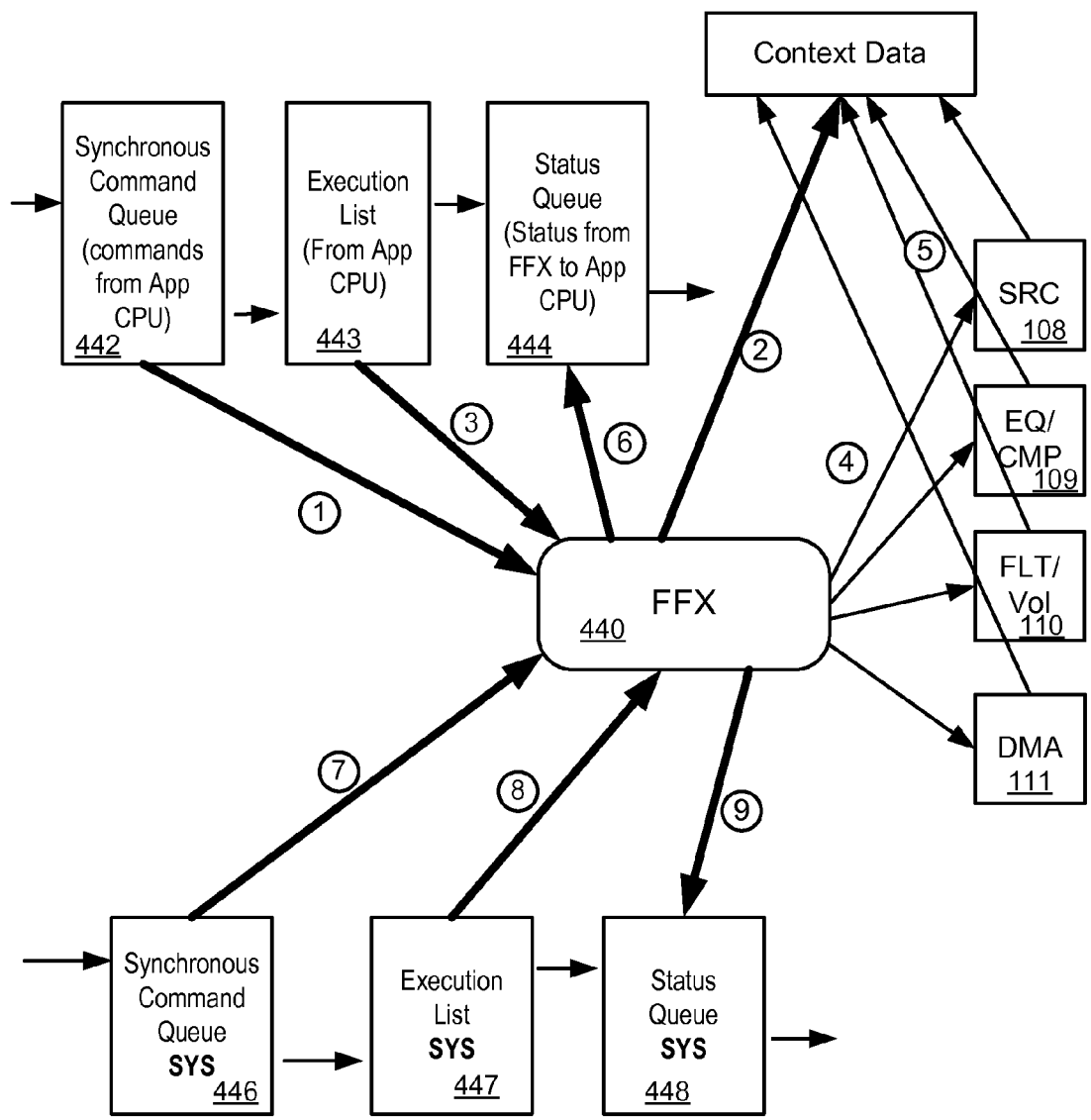
FIG. 4 is a block diagram showing an example implementation in which an intermediate processor is used with audio fixed function processing blocks, according to one example embodiment
Figure 5:
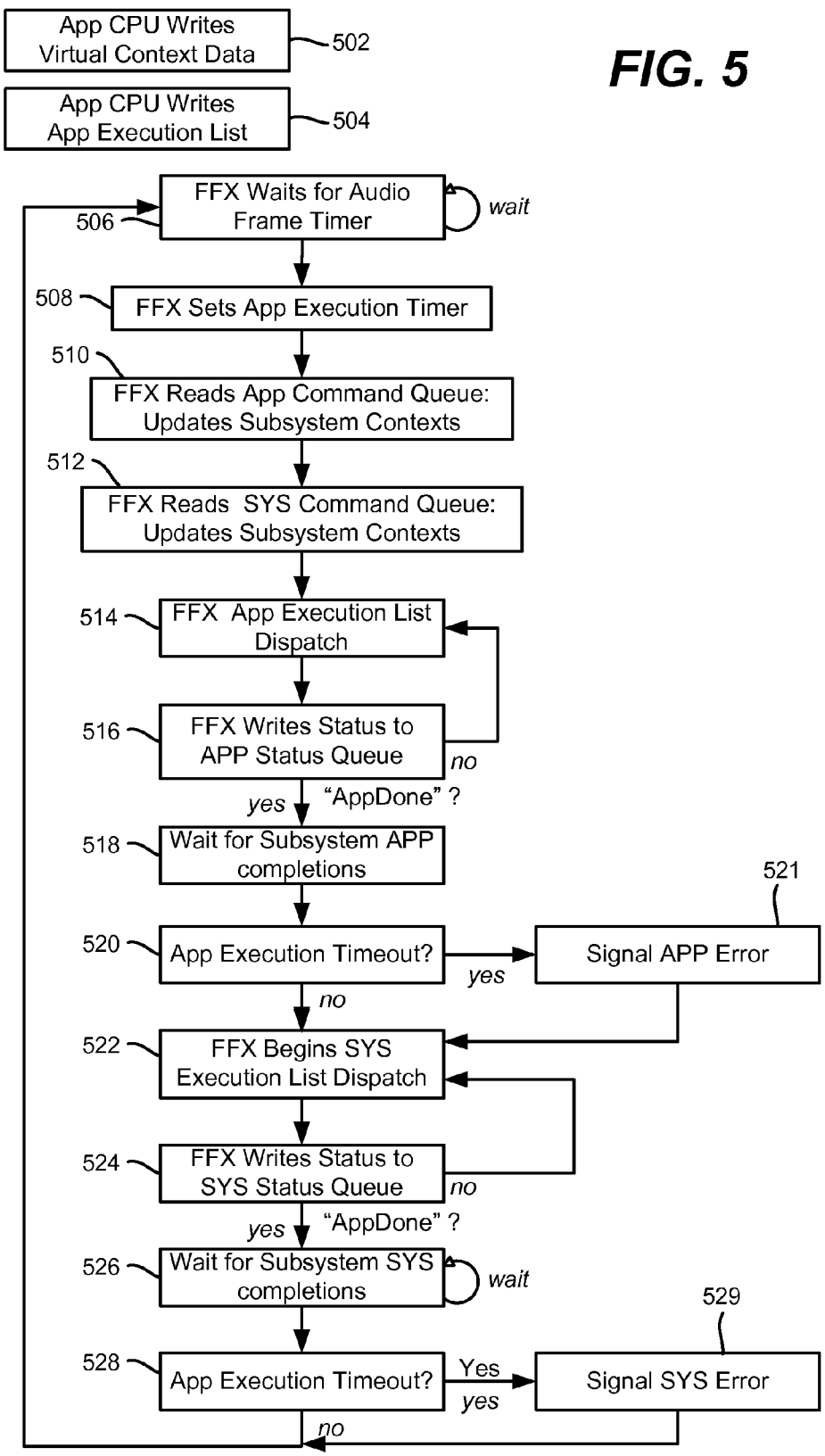
FIG. 5 is a flow diagram showing example steps that may be used with the intermediate processor of FIG. 4, according to one example embodiment.

Turning to one example implementation generally represented in FIGS. 4 and 5, an FFX (intermediate) processor 440 (FIG. 4) may be used to coordinate the flow of command and status from the main application CPU 112 and the audio processing subsystem hardware blocks 108-111. By using an intermediate processor, the main application CPU 112 can control audio processing and flow without having to use CPU cycles communicating directly with the hardware. For example, when using the audio processing subsystem hardware blocks, two sets of data may be set up, namely hardware context data and an execution list as described above. To avoid putting an undue burden on the application CPU, instead of the application CPU 112 directly setting the contents of hardware contexts, the application issues commands via the FFX processor 440 to do so, which is accomplished by putting appropriate commands into a command queue, an instance of which is shown labeled as 442. If the command queue 442 is not full, this is a non-blocking operation.

The FFX processor 440 takes commands from the application CPU 112 in the command queue 442 and processes them at an appropriate time. Commands may set particular context fields or contain pointers to entire context blocks. Provided that the command queue 442 is deep enough, the application CPU 112 can direct the FFX processor 440 to update hardware contexts of fields without blocking or waiting for the individual audio processing subsystem hardware blocks to complete their operations, as that is the responsibility of the FFX processor 440.

The Application CPU 112 sets up the APP audio processing subsystem Command List (AppSCL). The command list comprises a mechanism by which the application CPU 112 sets the bitfields in the contexts, which control the audio processing subsystem blocks as well as algorithms that may be running on the CODEC processor. In order to attempt to minimize the amount of application CPU 112 used, in one implementation, the application CPU 112 does not write to the 'live' context data fields. Instead, the application CPU 112 writes to "virtual contexts", which are mirror versions of the actual contexts, as generally represented at step 502 (FIG. 5). After writing the data to the virtual context, the application CPU 112 pushes a command into the App subsystem Command List (AppSCL). If the AppSCL is full, the App waits until room frees up, ordinarily after the next audio frame is processed.

The application CPU 112 creates an App Execution List 443 (AppEL) (step 504 of FIG. 5). The App execution list 443 specifies the audio signal flow graph of the application by specifying the commands to be dispatched to the hardware execution units and the mix buffers used as the inputs and outputs for those units.

At step 506 of FIG. 5, the FFX processor 440 (FIG. 4) waits for the timer that signifies it is time to start processing the next audio frame. The FFX processor 440 also starts an App Execution Timer at step 508. The App execution time specifies the amount of real time allocated for the application command and execution list to execute. Steps 510 and 512 represent the FFX processor 440 reading the application command queue and the system command queue, respectively, which may then be used to update the contexts of the subsystem blocks.

At step 514, the FFX processor 440 begins dispatching commands from App execution list 443, in order, to the execution units. This includes processing the mix buffer allocation commands to ensure there are sufficient mix buffers available to execute the commands. Dispatching continues until the FFX processor 440 reaches the APP-DONE command at step 516, signifying the end of the App execution list 443. Note that as also represented in step 516, as part of the execution and dispatch process, the FFX processor 440 may return status back from the subsystem units and place status entries into the Application Status Queue 444.

The FFX processor waits for the App commands to complete, that is, for completion of the App execution list 443; with the hardware blocks reporting their completion. If the execution timer (set at step 508) expires before the App execution list 443 has fully executed, the application has either oversubscribed the subsystem hardware, or the subsystem execution was delayed for some other reason such as APP audio software not providing sample rate conversion data or DMA data to the subsystem in a timely manner.

As can be seen, steps 522, 524, 526, 528 and 529 are similar to those described, but deal with the system command queue 446 and system execution list 447, with a status queue 448 updated and returned. The timer (or a different timer) may be set as desired for the system completions.

Turning to message queues and interprocessor communication, communication between hardware units is done via a number of Command Queues. Note that in one implementation there are five distinct hardware units (application CPU 112, MEC Proc 1, MEC Proc2, Codec Proc, FFX), full bidirectional communication between all blocks would require twenty command queues, however in practice not all possible paths are needed.

Command queue register files are directed towards communication between various hardware blocks, which is performed with a set of command queues. These command queues are used to pass short messages from unit to unit. The command queues are defined by a shared register set across the processors and hardware blocks that need to access them. Queues are defined by software.

Figure 6:
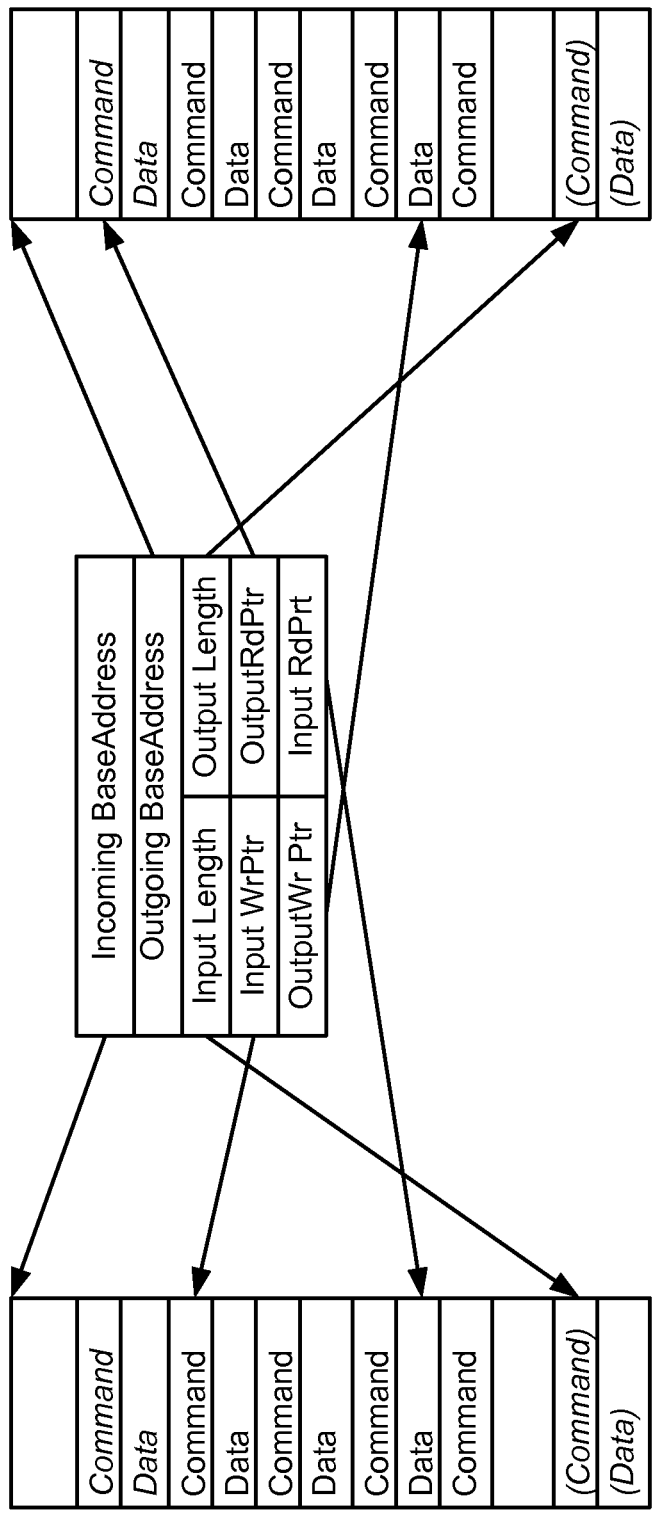
FIG. 6 is a representation of bi-directional command queues used for communication among components of the audio environment, according to one example embodiment.

Creating a pair of bi-directional command queues can be specified using four or five 32-bit registers. This is achieved by specifying incoming and outgoing base addresses, 16-bit queue lengths. In order to achieve coherency, the 16-bit read pointer for one queue shares a 32-bit register with the 16-bit write pointer for each of the two queues. This ensures that only one processor will ever write to the 32-bit register designated for its input and output. FIG. 6 shows such bi-directional command queues.

Communication between the various audio control processors is done by way of messages. Message queues come in pairs: input and output. Not every potential path between units has a queue; the table below shows which units may need messaging queues:

|  | TO | | | | |
| --- | --- | --- | --- | --- | --- |
| From | MEC1 | MEC2 | CODEC | FFX | APP |
| MEC1 | Queue Not Needed |  | X | Queue Not Needed | X |
| MEC2 | x | Queue Not Needed |  | Queue Not Needed |  |
| CODEC | X |  | Queue Not Needed | X | X |
| FFX | Queue Not Needed | Queue Not Needed | X | Queue Not Needed | X |
| APP | X | x | x | X | Queue Not Needed |

Messaging queues are designed to minimize spin/lock states between processors by avoiding contention wherever possible. In one implementation, message queues comprise circular buffers, which are unidirectional between processors. The entries themselves are stored in system memory, while the base address, read and write pointers are located in the register file. Because in one implementation only a single processor writes to each queue, there are no possibilities for collisions, just stale data, which is managed by software. Each message queue pointer needs to be updatable atomically by a given processor; only one processor writes to a given pointer. Therefore, in one implementation the pointers are one bit larger than actual size of the queues. This eliminates the need for a "Full" flag, used to distinguish between the cases where the buffer is completely full versus completely empty.

Figure 7:
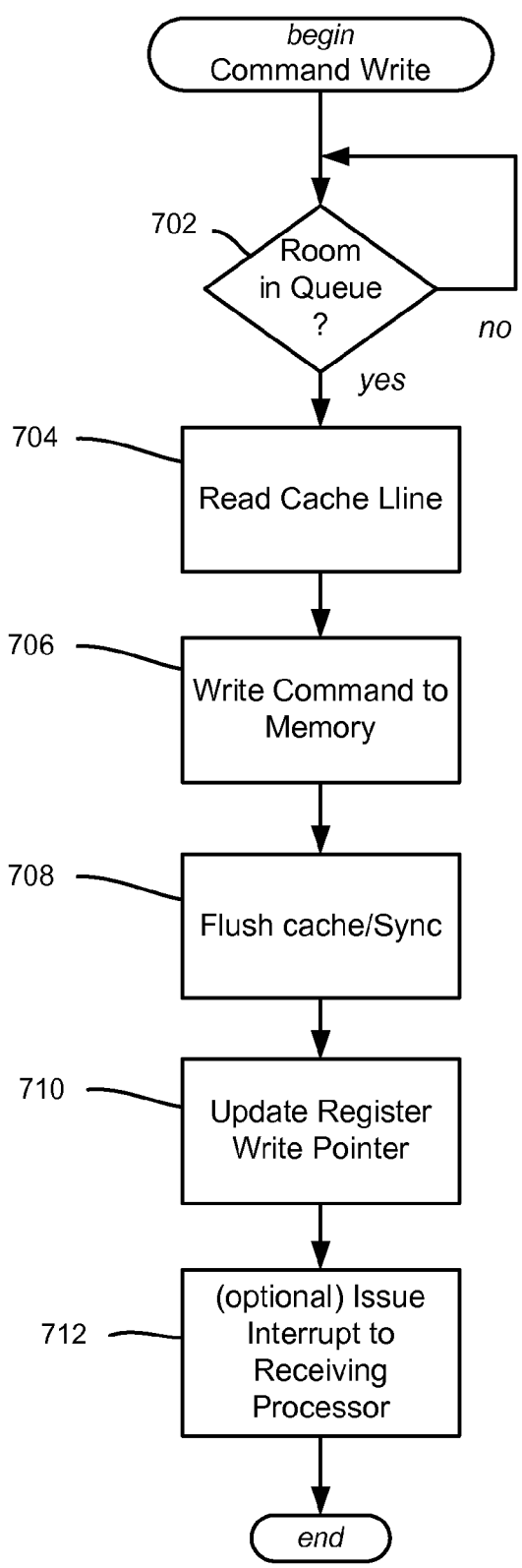
FIG. 7 is a flow diagram representing writing to a command queue, according to one example embodiment.

When a processor needs to send a message to another processor, the sending processor reads the pointers to ensure there is room to write the message(s), as generally represented at step 702 of in FIG. 7. When there is room, via steps 704 and 706 the sending processor writes the messages to main memory starting where the pointer points; note that the sending processor has to take care to first read in the cache line (step 704) containing that start to avoid overwriting previous entries. Once the messages have been written, at step 708 the sending processor flushes that data out to memory with a cache flush and sync, and then updates (step 710) the write pointer for the queue to indicate the new data. A receiving processor may poll the read and write pointers of its inbound message queues. Alternatively (or in addition to), the sending processor may issue an interrupt (step 712) to the receiving processor signifying that a message has been posted to the message queue.

Figure 8:
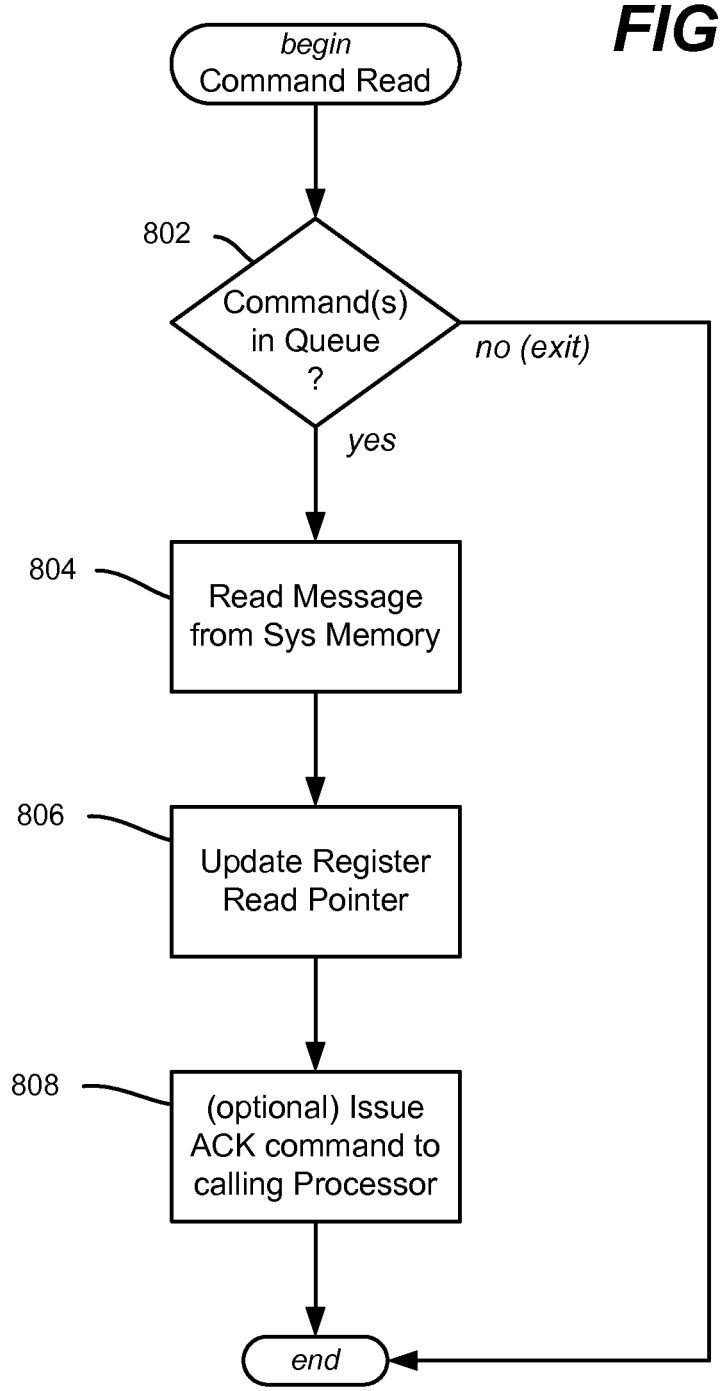
FIG. 8 is a flow diagram representing reading from a command queue, according to one example embodiment.

When received commands are queued, as represented in step 804 of FIG. 8, the receiving processor starts reading the messages from system memory (step 804). If the receiving processor reads the data into caches, the receiving processor has to ensure that the cache line does not get written back to memory and overwrite new messages. Once the message reading is completed, the receiving processor updates the read pointer for the message queue. An optional ACK may be returned at step 808.

The semantics of the commands between processors is determined by software. Typically they are of the type: Command:Data. If Data 0 and Data 1 are sufficient, they are all that are used. Otherwise, Data 1 may point to additional data in system memory to be used.

| Command | Data 0 (24 bits) |
|---|---|
| Data 1 (32 bits) | |

With respect to status registers, to provide status and acknowledgement between processors, a 32-bit register is assigned to each processor (MEC1,MEC2,CODEC,FFX, APP) in one implementation. The registers provide both MessageRdy bits to each other processor and ACK bits to each other processor. For example the CODEC processor status register may be specified as follows:

| CODEC PROC STATUS REGISTER | | |
|---|---|---|
| Bit | | |
| 0 | CODECMsgRdy2APP | Codec processor Message ready bit to Application CPU 112 |
| 1 | CODECMsgRdy2FFX | Codec Processor Message Ready to FFX |
| 2 | CODECMsgRdy2MEC1 | Codec Processor Message Ready to MEC1 |
| 3 | CODECMsgRdy2MEC2 | Codec Processor Message Ready to MEC2 |
| ... | | |
| 16 | CODECAck2APP | Codec Processor ACK message to application CPU 112 |
| 17 | CODECAck2FFX | Codec Processor ACK message to FFX |
| 18 | CODECAck2MEC1 | Codec Processor ACK message to MEC1 |
| 19 | CODECAck2MEC2 | Codec Processor ACK message to MEC2 |

Figure 9:
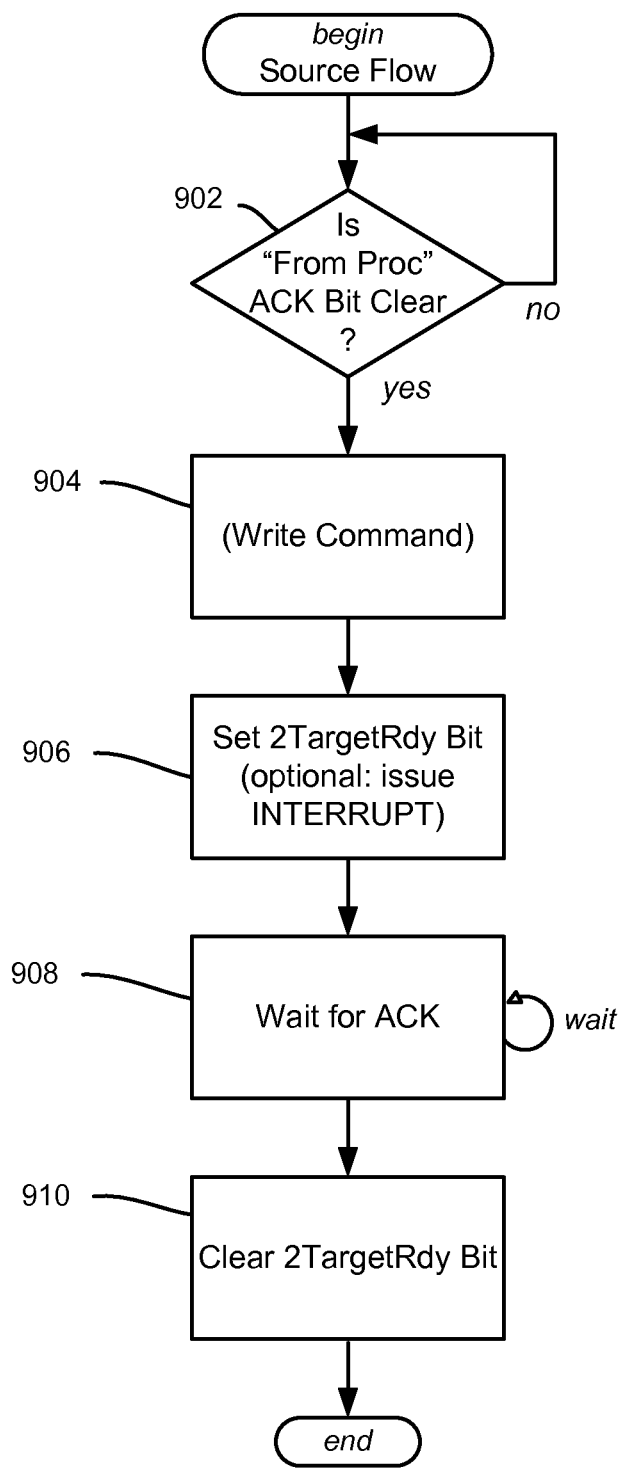
FIG. 9 is a flow diagram representing processor status register usage for a source, according to one example embodiment.
Figure 10:
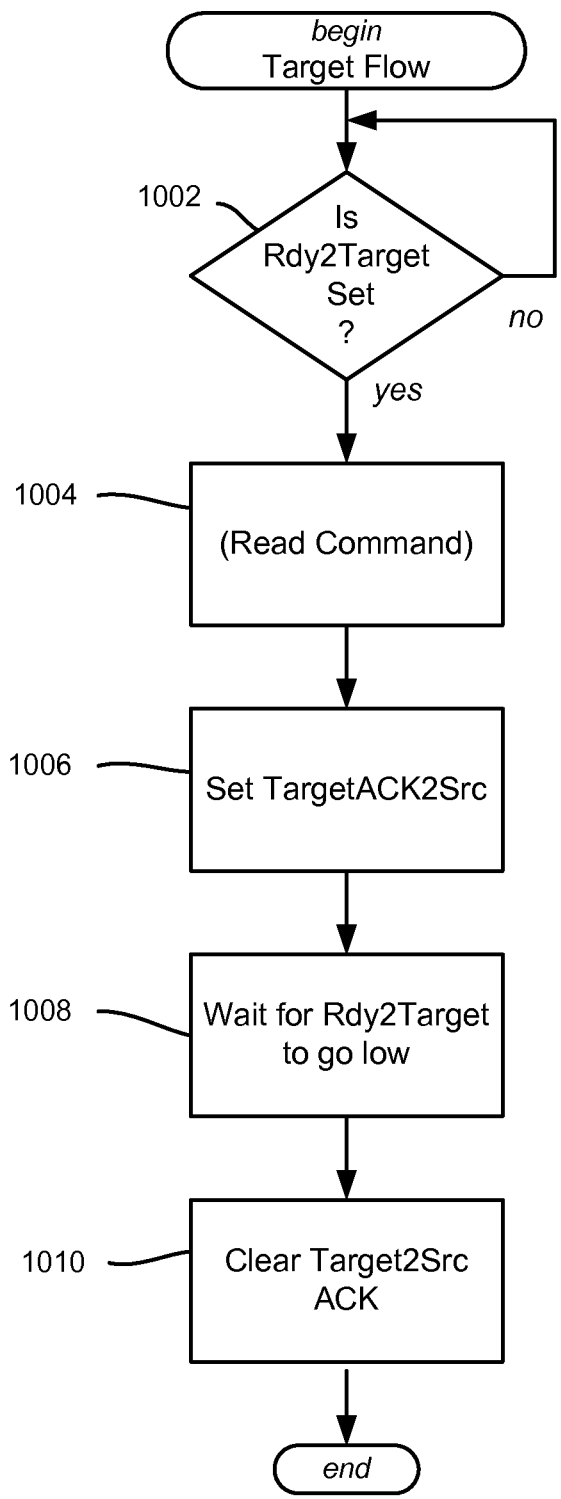
FIG. 10 is a flow diagram representing processor status register usage for a target, according to one example embodiment.

FIGS. 9 and 10 shows typical processor status register usage for calling (Source) and destination (Target) processors, respectively. When a processor (source) needs to communicate with another processor (target), at step 902 the source first checks the source ACK bit from the other processor's status register. If clear, the source then writes the command data at step 904 and sets the SourceMsgRdy2Target bit in its own Status Register at step 906; an interrupt may be issued. The source then waits for an ACK from the target.

When via steps 1002 and 1004 of FIG. 10 the target processor processes the message, the target processor sets its own TargetACK2Source acknowledge bit at step 1006, until cleared via steps 1008 and 1010. At that point, the Source Processor can clear its SourceMsgRdy2Target bit at step 910.

Additional bits in the status registers can be used to provide specific data or specific messages from processor to processor. Any remaining registers may be used by software as scratch registers to facilitate efficient interprocessor communication where minimal data transfer is required.

In one implementation, the overall audio processing subsystem blocks are controlled by a set of global control registers. These specify address ranges, and provide read/write pointers to communication queues.

As described above, the audio processing subsystem hardware blocks are used to perform certain system-wide audio functions. The audio processing subsystem hardware blocks themselves (SRC, EQ, FLT, DMA) are shared by the application level components and the audio processing subsystem. In one implementation, this is facilitated by using separate execution lists and sets of contexts for the audio processing subsystem blocks, namely a system execution list (SEL) 333 and an application execution list (AEL) 332. During normal operation, processing subsystem commands are dispatched by the audio control processor 114, first by dispatching the application execution list 332 and then by dispatching the system execution list 333. In this way, the application's audio is processed, creating one or more application mixes. The system execution list commands are then dispatched. The system execution list 333 creates the final mixes ready for downmix, interleaving and/or multispeaker S/PDIF encoding.

In order for each application mix (speaker and per-player) to be properly mixed with system sounds, chat and music, described herein is a mechanism for handing off the application mixes to the system execution list 333. This is done by pre-defining specific mix buffers and designating them as AppSpeaker mix and AppPerPlayer Mixes. The system execution list 333 takes the AppSpeaker mix and AppPerPlayer Mixes, combines them with appropriate chat, music and system sound to create a FinalSpeaker mix and FinalPerPlayer Mixes, where they are sent via DMA block 111 to system memory 104; from there, they are read by the CODEC processor and prepared for output.

Note that it is desirable to support the full performance of each of the hardware blocks that read/write the mix buffers. For example, a function block may wait for a mix buffer to have all its input data received; if a command cannot be executed because of having to wait for input data, that command may be skipped over, so that the block can process another mix buffer. The audio control processor 114 is able to issue commands to the hardware blocks (and service them) fast enough to keep the hardware blocks 108-111 busy, e.g., including updating an appropriate amount of the context data for the hardware blocks in between audio frames (128 samples). For example, at a one gigahertz operation frequency, 512 channels of XMA, SRC, EQ/CMP, 2560 channels of FLT/VOL, 256 channels of DMA, and a 48 kHz sample rate with a 128 sample block size, approximately correlates to 1.5M audio frames/sec, or 650 processor clock cycles/audio frame. However, blocks may be throttled as needed. Also, registers may be staged such that some form of time division multiplexing may be used.

Figure 11:
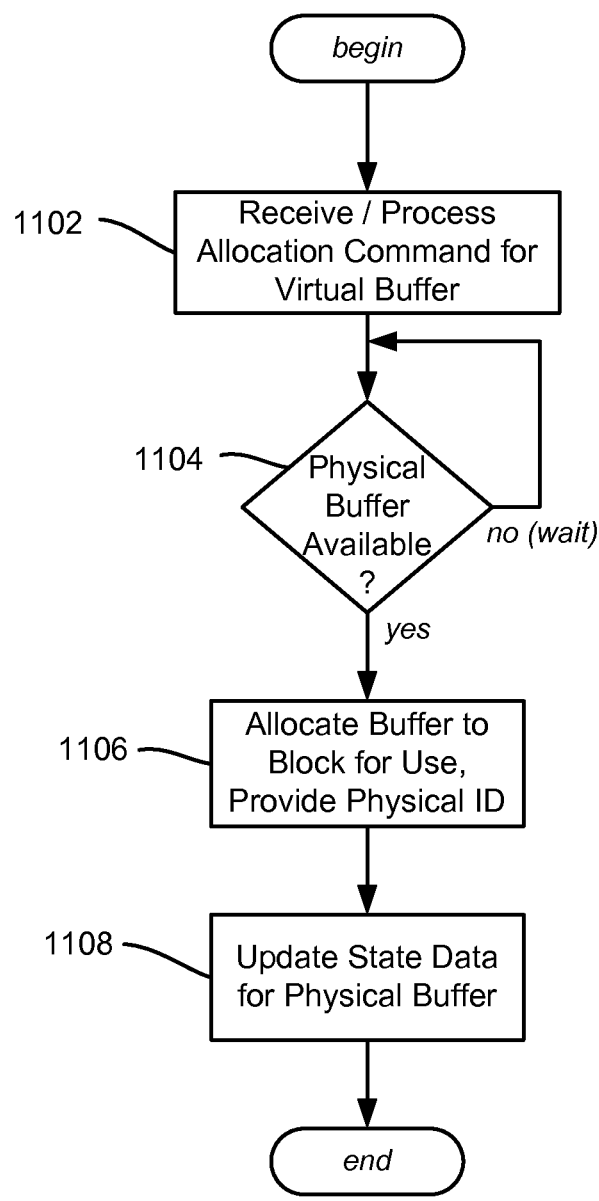
FIG. 11 is a flow diagram representing example steps taken to allocate a physical mix buffer for a virtual mix buffer, according to one example embodiment.

FIG. 11 is a summary of some of the steps taken with respect to allocation of a physical mix buffer for a virtual mix buffer. Step 1102 represents receiving the allocation request and processing the request, which may include waiting until a physical buffer is available, as represented by step 1104. When one is available or becomes available, step 1106 represents allocating the buffer for access by the block associated with the command/virtual buffer, including providing a physical identifier of the buffer to the block. Step 1108 represents updating the state data that tracks the state of the physical buffer to reflect the allocation.

Figure 12:
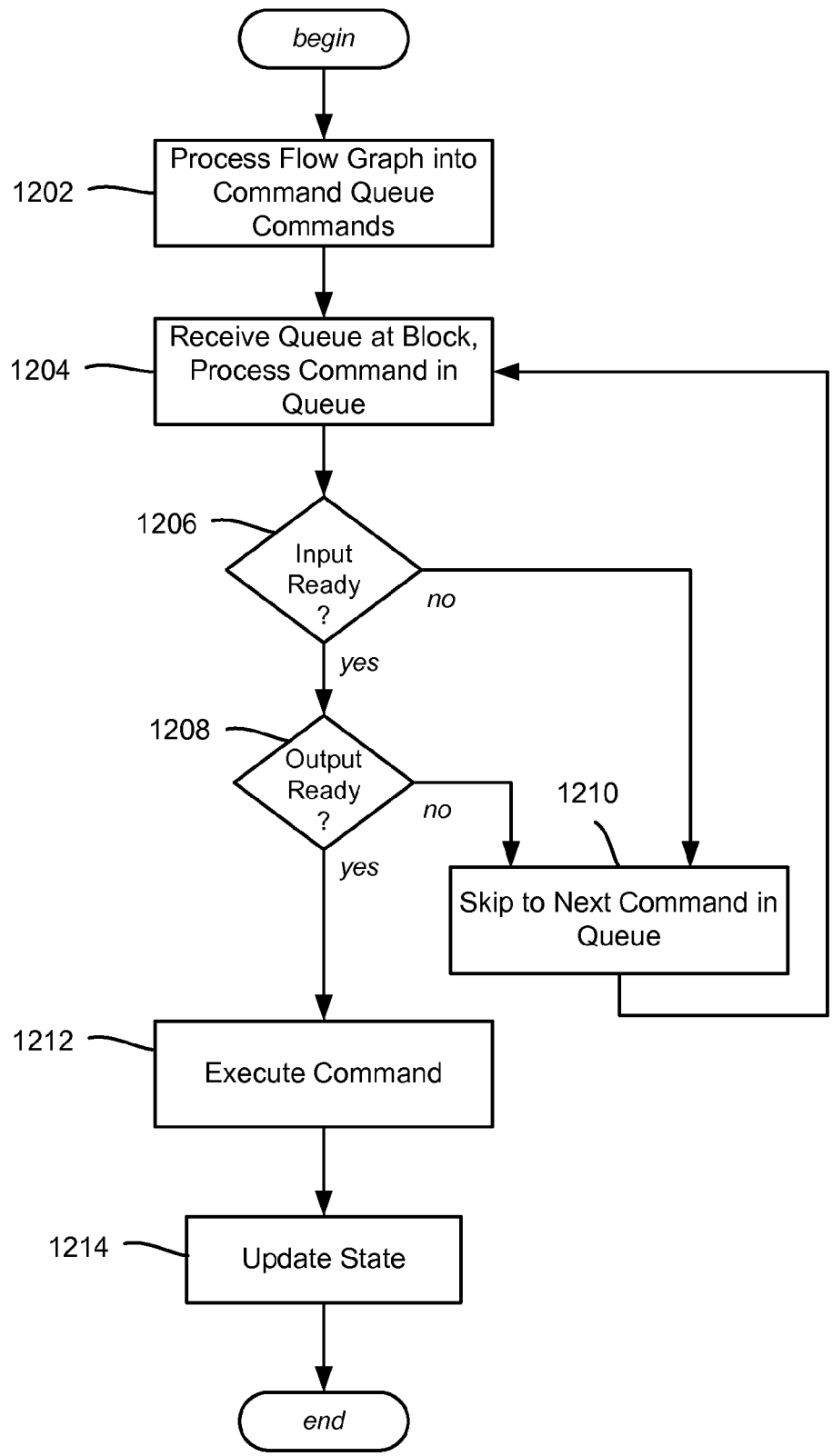
FIG. 12 is a flow diagram representing example steps taken to process a queued command, according to one example embodiment.

FIG. 12 is a summary of some of the steps taken with respect to executing a command from the command queue, where the command is associated with one or more allocated buffers. Step 1202 represents processing the flow graph (by the application) to provide a command into the command queue. At step 1204, when a block receives the queue, the block processes a command in the command queue. If the input data is not ready, (e.g., because one or more other blocks or system components have not completed processing their data into the input data for the block), step 1206 branches to step 1210 where the block skips ahead to the next command in the queue (if any), and attempts execution of that command.

If the input is ready, but the output buffer is not ready at step 1208, (e.g., multiple sources may accumulate data into an output buffer, and another source may be using that output buffer), the block similarly skips to the next command, if any. In this way, the block does not wait if other commands can be executed, but will wait if there is no command determined to be ready for execution. Note that steps 1208 may be reversed.

When the input data and output buffer are ready, step 1212 represents executing the command, e.g., processing the input data into data written/accumulated into the output buffer. Step 1214 represents updating the state data for the physical buffer or buffers that were used. For example, if the input data is in a physical input buffer, one of the inputs is now finished which is reflected in the state data for that physical input buffer (which may be de-allocated if all inputs are done). Similarly, the output buffer has its output count adjusted upon completion of the output of this block so that further blocks know when the previous processing is complete.

In one implementation, commands for each execution list and commands for the command and the control queue take the form of:

COMMAND [arg1], [arg2], . . . .

Note that these are human readable formats; however, execution list commands may be binary in practice, with variable command sizes based on the arguments needed for each command. For example, four bits at the beginning of each command (Command[3:0]) are used in one implementation to indicate which command is used. Example syntax and description for each command described below. Because these commands are generated and processed by software on the CPU 112 and firmware on the audio control processor 114, respectively, they relatively straightforward to update.

Execution List Commands

The ALLOC command is used to allocate a physical MixBuffer for use. The execution list uses virtual IDs for MixBuffer assignments. When an ALLOC command is executed, a physical MixBuffer is bound to a given virtual ID. Subsequent commands that use a given virtual ID are directed to the allocated physical MixBuffer. The ALLOC command is dispatched from the audio control processor 114 to the mix buffer block 116, which is the actual device that does the virtual ID to physical MixBuffer binding. The format of the ALLOC command, with the bits' meanings, is:

| ALLOC MBVID, NumIn, NumOut, Gain | | |
|---|---|---|
| Field | Bits | Assignment |
| Command | 4 | The ALLOC command is assigned a value of 0x1. |
| MBVID | 13 | Mixbuffer virtual ID. A value of 0 is reserved. |
| NumIn | 10 | Specifies the number of inputs that this MixBuffer will receive. This is used by MixBuffer state management to know when all expected inputs have been received and that the data in the MixBuffer can then be used for output. A value of 0 is reserved. A value of 0xFF indicates that an unknown number of inputs will be used (in that case, the audio control processor will update state accordingly (via another instruction) once all inputs have been received). |
| NumOut | 10 | Specifies the number of times that the contents of this MixBuffer will be used. This is used by MixBuffer state management to know when all expected outputs have been made and that the mixbuffer can be returned to the allocation pool. A value of 0 is reserved. A value of 0xFF indicates that the MixBuffer will be used an unknown number of times (in that case, the aduio processor will update state accordingly (via another instruction) once all outputs have been generated). |
| Gain | 3 | Specifies the coarse gain (bit shift) to apply to any inputs being supplied to the mixbuffer. A value of 0 is no shift, a value of 7 shifts the input down by 7 bits prior to the multiply accumulate. |

The SRC command indicates that a sample rate conversion pass is needed. SRC operates in one of two modes: MONO, or STEREO. In MONO mode, data is read from system memory on a sample-by-sample basis and written (after SRC) to a mix buffer (MixBuffer). In STEREO mode, the data is interpreted as interleaved (Left/Right) stereo PCM data; each channel is output to a separate mix buffer.

The SRC command is dispatched to the SRC hardware block 108 for execution. The input data for the SRC block 108 is specified in the SRC (or XMA) contexts and resides in system memory. The output of the SRC 108 goes to one or more mix buffers. In one example implementation, each command corresponds to the output processing of one channel of 128 samples audio frame (at 48 kHz). The number of input samples consumed depends on the SRC ratio. The format of the command in the execution list is:

| SRC ContextNum, MBVID | | |
|---|---|---|
| Field | Bits | Assignment |
| Command | 4 | The SRC command is assigned a value of 0x2. |
| ContextNum | 12 | Specifies the SRC context number to use for this audio channel and block. More context space may be allocated than what can be processed simultaneously by the SRC block, generally to allow the CPU to dismantle/setup old/new stream context data while current stream context data is in use (avoids having hardware interlock waits in the CPU for highly utilized scenarios). |
| MBVID | 13 | Mixbuffer virtual ID. A value of 0 is reserved. |
| MBVID1 | 13 | Mixbuffer virtual ID. In STEREO mode, this MixBuffer will receive the output of the SRC for the Right channel (samples 1, 3, 5, 7, . . . counting from 0). |

The EQ command indicates that an equalizer/compression pass is needed. The EQ command is dispatched to the EQ hardware block 109 for execution. The input data for the EQ block 109 is a mix buffer. The sidechain data for the EQ block (if present) is also a mix buffer. The output of the EQ goes to a mix buffer. In one implementation, each command corresponds to the output processing of one channel of 128 samples audio frame (at 48 kHz). The format of the command in the execution list is:

| EQ ContextNum, MBVIDIn, MBVIDChn, MBVIDOut | | |
|---|---|---|
| Field | Bits | Assignment |
| Command | 4 | The EQ command is assigned a value of 0x3. |
| ContextNum | 12 | Specifies the EQ context number to use for this audio channel and block. More context space may be allocated than what can be processed simultaneously by the EQ block, generally to allow the CPU to dismantle/setup old/new stream context data while current stream context data is in use (avoids having hardware interlock waits in the CPU for highly utilized scenarios). |
| MBVIDIn | 13 | Mixbuffer virtual ID for the input data. A value of 0 is reserved. |
| MBVIDChn | 13 | Mixbuffer virtual ID for the compression sidechain data. A value of 0 is reserved. This value is really only used when the EQ/CMP block is configured for external sidechain control. However, in order to simplify EQ/CMP input command queue management, this value may be set to the same value as MBVIDIn for normal or internal sidechain control modes. |
| MBVIDOut | 13 | Mixbuffer virtual ID for the output data. A value of 0 is reserved. |

The FLT command indicates that an filter/volume pass is needed. The FLT command is dispatched to the FLT hardware block for execution. The input data for the FLT block is a mix buffer. The output of the FLT goes to a mix buffer. In one implementation, each command corresponds to the output processing of one channel of 128 samples audio frame (at 48 kHz). The format of the command in the execution list is

| FLT ContextNum, MBVIDIn, MBVIDOut | | |
|---|---|---|
| Field | Bits | Assignment |
| Command | 4 | The FLT command is assigned a value of 0x4. |
| ContextNum | 14 | Specifies the FLT context number to use for this audio channel and block. More context space may be allocated than what can be processed simultaneously by the FLT block, generally to allow the CPU to dismantle/setup old/new stream context data while current stream context data is in use (avoids having hardware interlock waits in the CPU for highly utilized scenarios). |
| MBVIDIn | 13 | Mixbuffer virtual ID for the input data. A value of 0 is reserved. |
| MBVIDOut | 13 | Mixbuffer virtual ID for the output data. A value of 0 is reserved. |

The DMA command indicates that data needs to be moved between a mix buffer and system memory 104. Although in one implementation the DMA command operates only on a single mix buffer, to accommodate multichannel (greater than mono) content, the DMA supports BLOCK offsets. This lets the DMA interleave its data with other DMA commands on a block basis. DMA Read and write operations are supported. The DMA command is dispatched to the DMA hardware block for execution. For DMA read operations, the input data resides in system memory and the destination is a mix buffer. For DMA write operations, the input data resides in a mix buffer and the destination is system memory. In one implementation, each command corresponds to the output processing of a single channel of 128 samples audio frame (at 48 kHz). The format of the command in the execution list is:

| DMA ReadWrite, NumChan, ContextNum, MBVID | | |
|---|---|---|
| Field | Bits | Assignment |
| Command | 4 | The DMA command is assigned a value of 0x5. |
| ReadWrite | 1 | Indicates whether a read or write command is to be performed. |
| ContextNum | 12 | Specifies the DMA context number to use for these audio channel(s) and block. More context space may be allocated than what can be processed simultaneously by the DMA block, generally to allow the CPU to dismantle/setup old/new stream context data while current stream context data is in use (avoids having hardware interlock waits in the CPU for highly utilized scenarios). |
| MBVID# | 13 | Mixbuffer virtual ID for the data. A value of 0 is reserved. |

The MB command is used to update mix buffer state. This includes the manual state handling that is needed when NumIn or NumOut was 0xFF when the buffer was allocated. The MB command is dispatched to the mix buffer hardware block 116 for execution. The format of the command in the execution list is:

| MB Function, MBVID | | |
|---|---|---|
| Field | Bits | Assignment |
| Command | 4 | The MB command is assigned a value of 0x6. |
| Function | 4 | Specifies the operation to perform: 1 - All inputs finished 2 - All outputs complete, return to allocation pool |
| MBVID | 13 | Mixbuffer virtual ID for the data. A value of 0 is reserved. |

The WAIT command is used to halt execution of the command execution list until a particular condition has been met. The WAIT command is handled by the audio control processor 114 for execution. The format of the command in the execution list is:

| WAIT Condition, Interrupt | | |
|---|---|---|
| Field | Bits | Assignment |
| Command | 4 | The WAIT command is assigned a value of 0x7. |
| Condition | 8 | Specifies what to wait for. This is a bit mask indicating all the conditions to wait for. Bit 0 - Wait for XMA. Since the XMA is meant to free run, this means wait until either the XMA is disabled or stalled (i.e. there are no channels that have any processing they can do.) Bit 1 - Wait for SRC. Waits until the SRC block is not busy. Bit 2 - Wait for EQ. Waits until the EQ block is not busy. Bit 3 - Wait for DMA. Waits until the DMA block is not busy. Bit 4 - Wait for FLT. Waits until the FLT block is not busy. |

WAIT Condition, Interrupt

| Field | Bits | Assignment |
|---|---|---|
| | | Bit 5 - Wait for all outstanding memory transactions to complete |
| | | Bit 6 - Wait forever. Basically, the CPU 112 has to come in and reset the audio control processor |
| | | Bit 7 - Wait for audio timer tick. |
| Interrupt | 4 | Indicates the interrupt condition to generate when WAIT command completes. This also may be used to generate an interrupt with no wait conditions flagged. |

The DONE command is used to indicate final completion of the command execution list and that the audio control processor is to begin the next iteration (starting with processing the various queues). The DONE command is handled by the audio control processor for execution. The format of the command in the execution list is:

DONE

| Field | Bits | Assignment |
|---|---|---|
| Command | 4 | The DONE command is assigned a value of 0x8. |

Note that in one implementation, DONE is a reserved audio processing subsystem command, only to be used by the system execution list 333 (FIG. 3), and is not used by a general application processor 112.

The APPDONE command is used to signify the end of the application's execution list 332; (note that an application provided execution list 332 which does not contain an APPDONE command is an invalid execution list). The APPDONE command is handled by the audio control processor 114 for execution. Upon processing the APPDONE command, the audio control processor 114 waits for all outstanding application-provided commands to complete. From there, the system execution list 333 begins execution. The format of the command in the execution list is

APPDONE

| Field | Bits | Assignment |
|---|---|---|
| Command | 4 | The APPDONE command is assigned a value of 0x8. |

Audio Processing Subsystem Command and Control Queue Commands

A general intent of the command and control queue is to reduce/remove hardware interlocks between the system and application CPU(s) and the audio processing subsystem components. Note that updating all contexts every audio frame is not intended for this queue; instead the extra addressable context space for each block is intended to be used for situations where every context is updated on every audio frame. The command and control queue is also not intended for main initialization, which is the CPUs' responsibility.

The REGWR command is used to write a register in the audio processing subsystem. It can be used to write to any register in the HW blocks as well as registers in the audio processing subsystem control status register space. Examples of its intended usage include resetting and initializing the hardware blocks, changing context base pointers, clearing latched status bits, and so forth. The REGWR command is:

REGWR Address, Data

| Field | Bits | Assignment |
|---|---|---|
| Command | 4 | The REGWR command is assigned a value of 0x1. |
| Address | 16 | Address to write |
| Data | 32 | Data to be written |

The REGWRM command is used to write certain bits to a register in the audio processing subsystem. It can be used to write to any register in the hardware blocks as well as registers in the audio processing subsystem control status register space. Examples of its intended usage include resetting and initializing the HW blocks, changing context base pointers, clearing latched status bits, and so forth. The audio control processor implements this by doing a read modify write of the register selected.

REGWRM Address, Data, Mask

| Field | Bits | Assignment |
|---|---|---|
| Command | 4 | The REGWRITE command is assigned a value of 0x2. |
| Address | 16 | Address to write |
| Data | 32 | Data to be written |
| Mask | 32 | Mask indicating which bits to be written |

The CONUPDATE command is used to update the contexts for the hardware blocks that reside in system memory. The CONUPDATE command is primarily used to update target values within these contexts at audio frame boundaries. Initialization is primarily accomplished by writing directly to the extra context space allocated in the system memory using the system application CPU 112 and adding those streams to the command instruction list. The command itself indicates which context ID to update, which context ID to get the target values from, and which parameters to update. The audio control processor implements this by doing a read modify write of the system memory.

CONUPDATE Block, DestConNum, SrcConNum, Mask

| Field | Bits | Assignment |
|---|---|---|
| Command | 4 | The CONUPDATE command is assigned a value of 0x3. |
| Block | 3 | Context Block to update. |
| | | 0 - reserved |
| | | 1 - XMA |
| | | 2 - SRC |
| | | 3 - CMP/EQ |
| | | 4 - FLT/VOL |
| | | 5 - DMA |
| | | 6-7 reserved |
| DestConNum | 16 | Destination Context to Update |
| SrcConNum | 16 | Source Context to use |
| Mask | 32 | Bits indicated what fields to update (dependent on the block selected) |

Example Operating Environment

It can be readily appreciated that the above-described implementation and its alternatives may be implemented on any suitable computing device, including a gaming system, personal computer, tablet, DVR, set-top box, smartphone and/or the like. Combinations of such devices are also feasible when multiple such devices are linked together. For purposes of description, a gaming (including media) system is described as one exemplary operating environment hereinafter.

Figure 13:
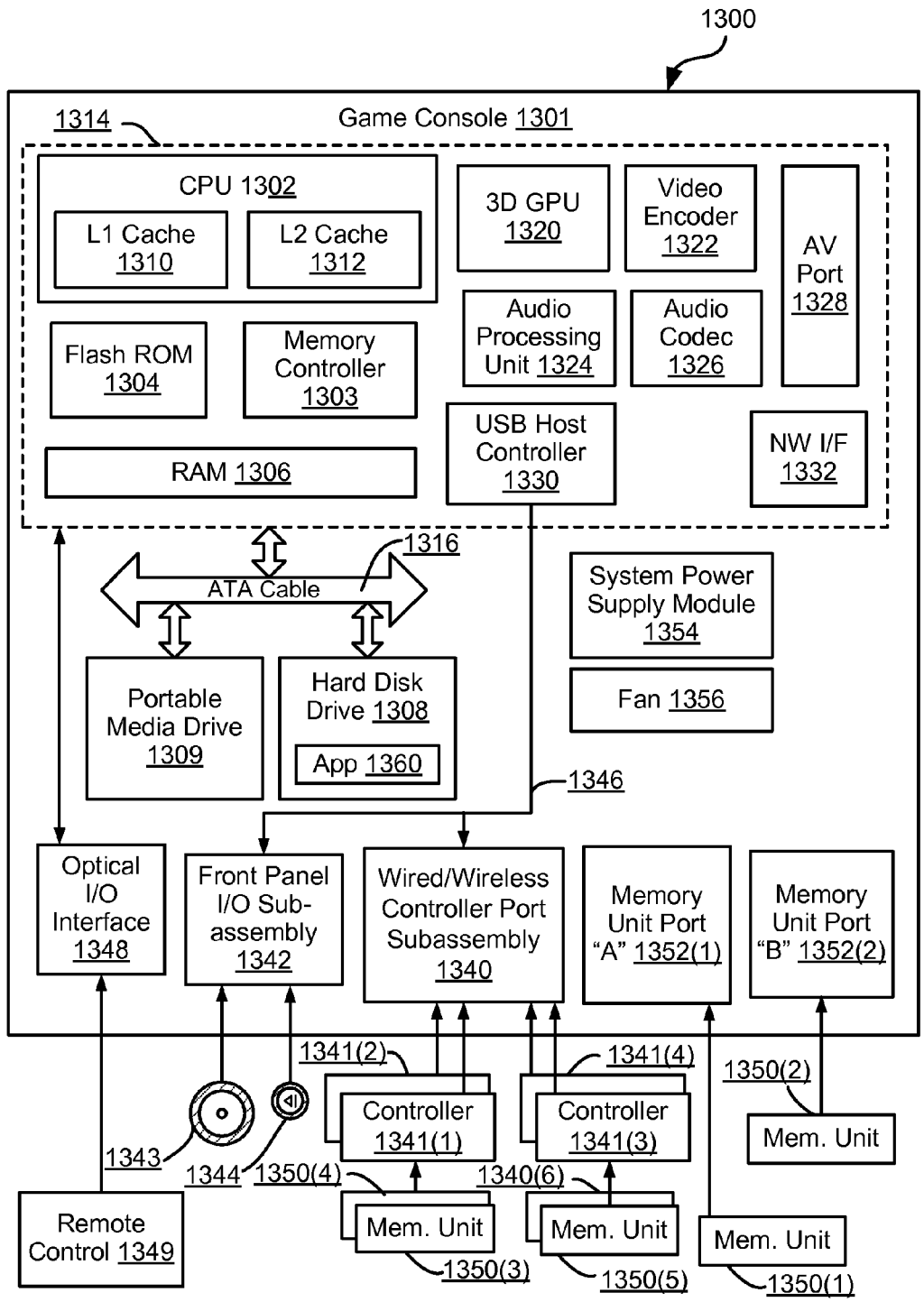
FIG. 13 is a block diagram representing an example computing environment, in the example of a gaming console, into which aspects of the subject matter described herein may be incorporated.

FIG. 13 is a functional block diagram of an example gaming and media system 1300 and shows functional components in more detail. Console 1301 has a central processing unit (CPU) 1302, and a memory controller 1303 that facilitates processor access to various types of memory, including a flash Read Only Memory (ROM) 1304, a Random Access Memory (RAM) 1306, a hard disk drive 1308, and portable media drive 1309. In one implementation, the CPU 1302 includes a level 1 cache 1310, and a level 2 cache 1312 to temporarily store data and hence reduce the number of memory access cycles made to the hard drive, thereby improving processing speed and throughput.

The CPU 1302, the memory controller 1303, and various memory devices are interconnected via one or more buses (not shown). The details of the bus that is used in this implementation are not particularly relevant to understanding the subject matter of interest being discussed herein. However, it will be understood that such a bus may include one or more of serial and parallel buses, a memory bus, a peripheral bus, and a processor or local bus, using any of a variety of bus architectures. By way of example, such architectures can include an Industry Standard Architecture (ISA) bus, a Micro Channel Architecture (MCA) bus, an Enhanced ISA (EISA) bus, a Video Electronics Standards Association (VESA) local bus, and a Peripheral Component Interconnects (PCI) bus also known as a Mezzanine bus.

In one implementation, the CPU 1302, the memory controller 1303, the ROM 1304, and the RAM 1306 are integrated onto a common module 1314. In this implementation, the ROM 1304 is configured as a flash ROM that is connected to the memory controller 1303 via a Peripheral Component Interconnect (PCI) bus or the like and a ROM bus or the like (neither of which are shown). The RAM 1306 may be configured as multiple Double Data Rate Synchronous Dynamic RAM (DDR SDRAM) modules that are independently controlled by the memory controller 1303 via separate buses (not shown). The hard disk drive 1308 and the portable media drive 1309 are shown connected to the memory controller 1303 via the PCI bus and an AT Attachment (ATA) bus 1316. However, in other implementations, dedicated data bus structures of different types can also be applied in the alternative.

A three-dimensional graphics processing unit 1320 and a video encoder 1322 form a video processing pipeline for high speed and high resolution (e.g., High Definition) graphics processing. Data are carried from the graphics processing unit 1320 to the video encoder 1322 via a digital video bus (not shown). An audio processing unit 1324 and an audio codec (coder/decoder) 1326 form a corresponding audio processing pipeline for multi-channel audio processing of various digital audio formats. Audio data are carried between the audio processing unit 1324 and the audio codec 1326 via a communication link (not shown). The video and audio processing pipelines output data to an A/V (audio/video) port 1328 for transmission to a television or other display/speakers. In the illustrated implementation, the video and audio processing components 1320, 1322, 1324, 1326 and 1328 are mounted on the module 1314.

FIG. 13 shows the module 1314 including a USB host controller 1330 and a network interface (NW I/F) 1332, which may include wired and/or wireless components. The USB host controller 1330 is shown in communication with the CPU 1302 and the memory controller 1303 via a bus (e.g., PCI bus) and serves as host for peripheral controllers 1334. The network interface 1332 provides access to a network (e.g., Internet, home network, etc.) and may be any of a wide variety of various wire or wireless interface components including an Ethernet card or interface module, a modem, a Bluetooth module, a cable modem, and the like.

In the example implementation depicted in FIG. 13, the console 1301 includes a controller support subassembly 1340, for supporting four game controllers 1341(1)-1341(4). The controller support subassembly 1340 includes any hardware and software components needed to support wired and/or wireless operation with an external control device, such as for example, a media and game controller. A front panel I/O subassembly 1342 supports the multiple functionalities of a power button 1343, an eject button 1344, as well as any other buttons and any LEDs (light emitting diodes) or other indicators exposed on the outer surface of the console 1301. The subassemblies 1340 and 1342 are in communication with the module 1314 via one or more cable assemblies 1346 or the like. In other implementations, the console 1301 can include additional controller subassemblies. The illustrated implementation also shows an optical I/O interface 1348 that is configured to send and receive signals (e.g., from a remote control 1349) that can be communicated to the module 1314.

Memory units (MUs) 1350(1) and 1350(2) are illustrated as being connectable to MU ports "A" 1352(1) and "B" 1352(2), respectively. Each MU 1350 offers additional storage on which games, game parameters, and other data may be stored. In some implementations, the other data can include one or more of a digital game component, an executable gaming application, an instruction set for expanding a gaming application, and a media file. When inserted into the console 1301, each MU 1350 can be accessed by the memory controller 1303.

A system power supply module 1354 provides power to the components of the gaming system 1300. A fan 1356 cools the circuitry within the console 1301.

An application 1360 comprising machine instructions is typically stored on the hard disk drive 1308. When the console 1301 is powered on, various portions of the application 1360 are loaded into the RAM 1306, and/or the caches 1310 and 1312, for execution on the CPU 1302. In general, the application 1360 can include one or more program modules for performing various display functions, such as controlling dialog screens for presentation on a display (e.g., high definition monitor), controlling transactions based on user inputs and controlling data transmission and reception between the console 1301 and externally connected devices.

The gaming system 1300 may be operated as a standalone system by connecting the system to high definition monitor, a television, a video projector, or other display device. In this standalone mode, the gaming system 1300 enables one or more players to play games, or enjoy digital media, e.g., by watching movies, or listening to music. However, with the integration of broadband connectivity made available through the network interface 1332, gaming system 1300 may further be operated as a participating component in a larger network gaming community or system.

CONCLUSION

While the invention is susceptible to various modifications and alternative constructions, certain illustrated embodiments thereof are shown in the drawings and have been described above in detail. It should be understood, however, that there is no intention to limit the invention to the specific forms disclosed, but on the contrary, the intention is to cover all modifications, alternative constructions, and equivalents falling within the spirit and scope of the invention.

What is claimed is:

1. A method for processing an allocation command corresponding to a virtual mix buffer associated with audio data to be processed, the method comprising:
    transmitting, to a mix buffer block by an audio control processor, a request to use the virtual mix buffer;
    allocating a physical mix buffer to the virtual mix buffer based on the request;
    receiving, from the mix buffer block by the audio control processor, an identifier of the physical mix buffer;
    receiving, from the audio control processor by an audio component block, an audio processing-related command associated with the virtual mix buffer; and
    using, by the audio component block, the physical mix buffer associated with the received identifier to process the audio data based upon the audio processing-related command.

2. The method of claim 1 wherein using the physical mix buffer comprises writing the audio data to the physical mix buffer as processed output data.

3. The method of claim 1 wherein using the physical mix buffer comprises reading the audio data in the physical mix buffer as input data for processing.

4. The method of claim 1 further comprising tracking a state of the physical mix buffer.

5. The method of claim 4 further comprising transmitting a request to de-allocate the physical mix buffer from the virtual mix buffer based upon the state of the physical mix buffer.

6. The method of claim 1 wherein a state of the physical mix buffer is associated with a number of inputs to be received by the physical mix buffer, the method further comprising waiting for the number of inputs to be received before using the physical mix buffer to process the audio data.

7. The method of claim 6 wherein waiting for the number of inputs to be received comprises skipping to another command.

8. The method of claim 1 further comprising requesting a virtual mix buffer to physical mix buffer lookup to determine the identifier.

9. The method of claim 1 further comprising requesting a lock for the physical mix buffer.

10. The method of claim 1, wherein allocating the physical mix buffer to the virtual mix buffer comprises:
    waiting to allocate the physical mix buffer until the physical mix buffer becomes available for use; and
    assigning an identifier of the physical mix buffer to the virtual mix buffer.

11. In a computing environment, a system comprising:
    a mix buffer component comprising a physical mix buffer, the mix buffer component configured to:
        receive an allocation command requesting allocation of the physical mix buffer to a virtual mix buffer; and
        allocate the physical mix buffer to the virtual mix buffer; and
    a fixed-function audio processing component configured to:
        transmit a request to use the virtual mix buffer based on an execution list command associated with the virtual mix buffer;
        receive, from the mix buffer component, an identifier of the physical mix buffer allocated to the virtual mix buffer; and
        use the physical mix buffer associated with the received identifier to process audio data based upon the execution list command.

12. The system of claim 11 wherein the fixed-function audio processing component is further configured to process a command queue, including to process a command that inputs data in the physical buffer for output.

13. The system of claim 11 wherein the fixed-function audio processing component is further configured to process a command queue, including to process a command that outputs processed data to the physical buffer.

14. The system of claim 11 wherein the fixed-function audio processing component comprises one or more of a sample rate conversion component, an equalization and compressor-expander component, and a filter and volume component.

15. The system of claim 11, further comprising at least one application central processing unit (CPU) processor, an intermediate processor coupled to the application CPU processor, and an audio control processor, wherein the audio control processor is coupled to the fixed-function audio processing component.

16. The system of claim 11 further comprising a direct memory access (DMA) component configured to transfer data from the physical mix buffer to a memory device accessible to an application central processing unit (CPU) processor, and to transfer data to the physical mix buffer from the memory device.

17. The system of claim 11 wherein the mix buffer component is further configured to lock down the physical mix buffer.

18. One or more computer-readable media having computer-executable instructions which, when executed, perform operations comprising:
    transmitting, to a mix buffer block by an audio control processor, a request to use the virtual mix buffer;
    allocating a physical mix buffer to the virtual mix buffer based on the request;
    receiving, from the mix buffer block by the audio control processor, an identifier of the physical mix buffer;
    receiving, from the audio control processor by an audio component block, an audio processing-related command associated with the virtual mix buffer; and
    using, by the audio component block, the physical mix buffer associated with the received identifier to process the audio data based upon the audio processing-related command.

19. The one or more computer-readable media of claim 18, wherein using the physical mix buffer comprises writing the audio data to the physical mix buffer as processed output data.

20. The one or more computer-readable media of claim 18, wherein using the physical mix buffer comprises reading the audio data in the physical mix buffer as input data for processing.

* * * * *